(12) United States Patent
Yoshikawa et al.

(10) Patent No.: US 11,125,612 B2
(45) Date of Patent: Sep. 21, 2021

(54) PHOTOELECTRIC CONVERSION ELEMENT AND PHOTOELECTRIC CONVERSION DEVICE

(71) Applicant: KANEKA CORPORATION, Osaka (JP)

(72) Inventors: Kunta Yoshikawa, Settsu (JP); Takashi Kuchiyama, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/808,161

(22) Filed: Mar. 3, 2020

(65) Prior Publication Data

US 2020/0200599 A1 Jun. 25, 2020

Related U.S. Application Data

(63) Continuation of application No. PCT/JP2018/020773, filed on May 30, 2018.

(30) Foreign Application Priority Data

Sep. 13, 2017 (JP) .............................. JP2017-176194

(51) Int. Cl.
*H01L 31/02* (2006.01)
*G01J 1/42* (2006.01)
(Continued)

(52) U.S. Cl.
CPC ........... *G01J 1/4257* (2013.01); *G01J 1/0407* (2013.01); *H01L 31/02019* (2013.01);
(Continued)

(58) Field of Classification Search
CPC .................... H01L 31/03452; H01L 31/02024
See application file for complete search history.

(56) References Cited

U.S. PATENT DOCUMENTS 4,366,377 A 12/1982 Notthoff et al.
4,926,036 A 5/1990 Maeda
(Continued)

FOREIGN PATENT DOCUMENTS

EP 3 171 406 A1 5/2017
JP S61-069170 A 4/1986
(Continued)

OTHER PUBLICATIONS

The Extended European Search Report issued by the European Patent Office dated Apr. 22, 2020, which corresponds to EP18855750.8-1230 and is related to U.S. Appl. No. 16/808,161.
(Continued)

*Primary Examiner* — Thanh Luu
(74) *Attorney, Agent, or Firm* — Studebaker & Brackett PC

(57) ABSTRACT

A photoelectric conversion element for detecting the spot size of incident light. The photoelectric conversion element includes a photoelectric conversion substrate having two principal surfaces, and the substrate includes a first sensitivity part and a second sensitivity part that are separated from each other. When a sensitivity area appearing on the principal surface of the first sensitivity part is defined as a first sensitivity area and a sensitivity area appearing on the principal surface of the second sensitivity part is defined as a second sensitivity area, the first sensitivity area receives at least a portion of incident light incident on a light receiving surface, and a pattern is formed such that an increase in an irradiation area of the principal surface irradiated with the incident light reduces the ratio of the first sensitivity area to the second sensitivity area in the irradiation area.

17 Claims, 17 Drawing Sheets

(51) Int. Cl.
   *G01J 1/04* (2006.01)
   *H01L 31/0216* (2014.01)
   *H01L 31/0224* (2006.01)
   *H01L 31/0232* (2014.01)
   *H01L 31/103* (2006.01)

(52) U.S. Cl.
   CPC .. *H01L 31/02161* (2013.01); *H01L 31/02325* (2013.01); *H01L 31/022408* (2013.01); *H01L 31/022466* (2013.01); *H01L 31/103* (2013.01)

(56) References Cited

U.S. PATENT DOCUMENTS

| | | | | |
|---|---|---|---|---|
| 5,825,071 | A * | 10/1998 | Takakura | H01L 31/103 257/440 |
| 6,372,531 | B1 | 4/2002 | Fujii | |
| 2001/0007501 | A1 * | 7/2001 | Frojdh | H01S 3/0014 356/480 |
| 2006/0044545 | A1 * | 3/2006 | Horn | G01C 3/08 356/4.01 |
| 2015/0340402 | A1 | 11/2015 | Yamanaka et al. | |

FOREIGN PATENT DOCUMENTS

| | | |
|---|---|---|
| JP | S63-151085 A | 6/1988 |
| JP | H01-266770 A | 10/1989 |
| JP | H02-062921 A | 3/1990 |
| JP | H02-072415 U | 6/1990 |
| JP | H06-20160 B2 | 3/1994 |
| JP | H08-018093 A | 1/1996 |
| JP | 2001-284632 A | 10/2001 |
| JP | 2002-367218 A | 12/2002 |
| JP | 2005-209294 A | 8/2005 |
| JP | 2009-244164 A | 10/2009 |
| JP | 2014-107446 A | 6/2014 |
| JP | 6093061 B2 | 3/2017 |
| WO | 2011/013172 A1 | 2/2011 |

OTHER PUBLICATIONS

International Search Report issued in PCT/JP2018/020773; dated Jun. 26, 2018.
International Search Report issued in PCT/JP2018/035030; dated Nov. 6, 2018. International Preliminary Report on Patentability; PCT/JP2018/035030; dated May 19, 2020. Translation of Written Opinion of the International Searching Authority; PCT/JP2018/035030; dated Nov. 6, 2018.

* cited by examiner

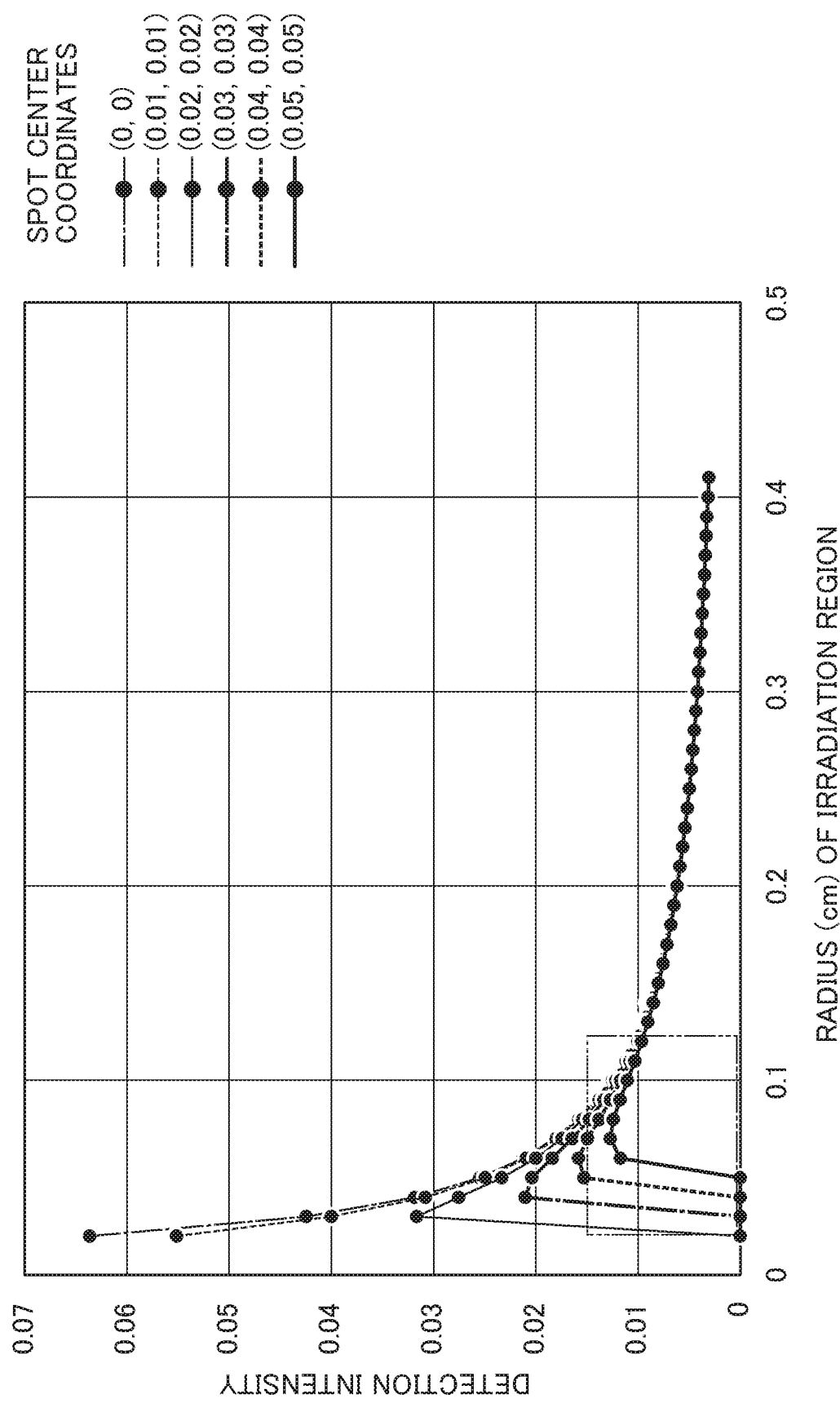

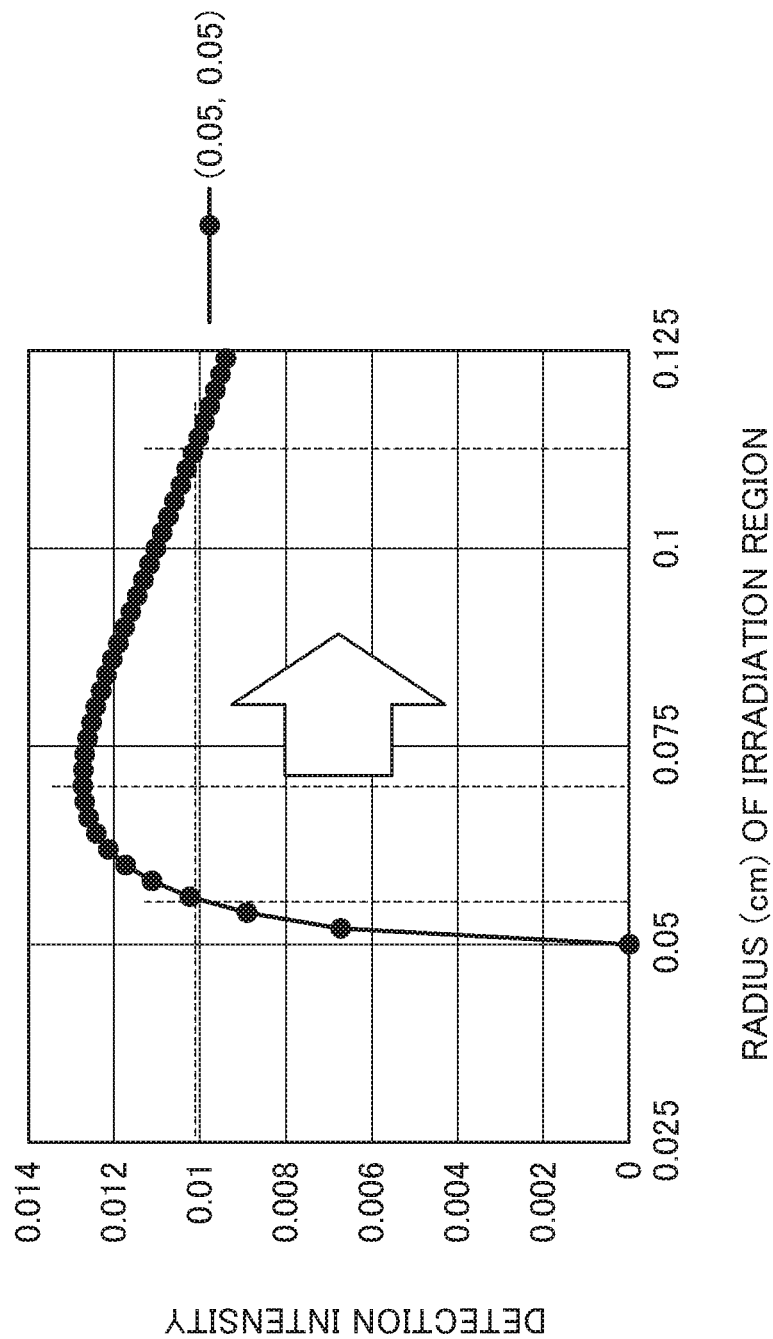

PHOTOELECTRIC CONVERSION ELEMENT AND PHOTOELECTRIC CONVERSION DEVICE

CROSS-REFERENCE TO RELATED APPLICATIONS

This application claims benefit of priority to International Patent Application No. PCT/JP2018/020773, filed May 30, 2018, and to Japanese Patent Application No. 2017-176194, filed Sep. 13, 2017, the entire contents of each are incorporated herein by reference.

BACKGROUND

Technical Field

The present disclosure relates to a photoelectric conversion element and a photoelectric conversion device used in the field of light detection or the like.

Background Art

Japanese Patent No. 6093061 discloses a photoelectric conversion element (semiconductor light receiving element) for detecting the intensity (illuminance) of incident light. An element using a crystalline silicon substrate is, for example, known as such a photoelectric conversion element. In the photoelectric conversion element using the crystalline silicon substrate, a dark current is relatively small and an S/N ratio is relatively high and sensitivity is high (stable response without depending on illuminance) even if the intensity of incident light is low.

SUMMARY

There is a demand for a photoelectric conversion element capable of detecting the spot size of incident light.

Accordingly, the present disclosure provides a photoelectric conversion element and a photoelectric conversion device for detecting the spot size of incident light.

A photoelectric conversion element according to the present disclosure is a photoelectric conversion element including a photoelectric conversion substrate having two principal surfaces, and includes a first sensitive part and a second sensitive part that are separated from each other. Assuming that a sensitive region appearing on the principal surface of the first sensitive part is a first sensitive region and a sensitive region appearing on the principal surface of the second sensitive part is a second sensitive region, the first sensitive region receives at least a part of incident light incident on the principal surface and forms a pattern for decreasing a ratio of the first sensitive region to the second sensitive region in an irradiation region as the irradiation region irradiated with the incident light on the principal surface increases.

A photoelectric conversion device according to the present disclosure includes an optical lens arranged on an upstream side of incident light and the above photoelectric conversion element arranged on a downstream side of the incident light.

According to the present disclosure, it is possible to provide a photoelectric conversion element and a photoelectric conversion device for detecting the spot size of incident light.

BRIEF DESCRIPTION OF THE DRAWINGS

FIG. 6A is a graph showing an example of characteristics of the detection intensity of the incident light in relation to a radius of the irradiation region of the incident light with the photoelectric conversion element;

FIG. 6B is a graph enlargedly showing a part of the characteristic when a deviation amount of a center position of the irradiation region of the incident light in FIG. 6A is (0.05, 0.05);

DETAILED DESCRIPTION

Embodiments of the present disclosure will be described with reference to the accompanying drawings below. Same or corresponding parts shall be denoted by the same reference numbers in each drawing. For the sake of convenience, hatching, member reference numbers, etc. may be omitted. However, in such cases, other drawings shall be referred to.

First Embodiment

Figure 1:
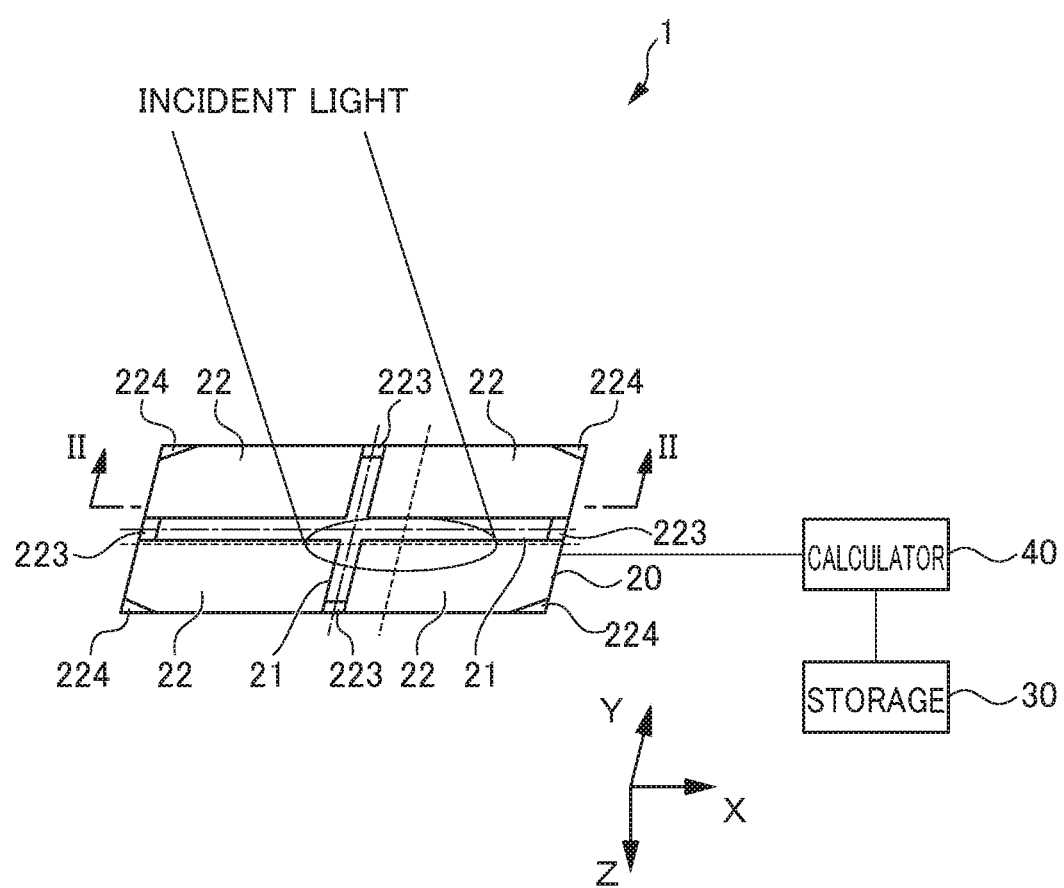
FIG. 1 is a view showing the configuration of a photoelectric conversion device according to a first embodiment.

FIG. 1 is a view showing the configuration of a photoelectric conversion device according to a first embodiment.

The photoelectric conversion device 1 shown in FIG. 1 detects not only the intensity of incident light, but also the spot size of the incident light. The photoelectric conversion device 1 includes a photoelectric conversion element 20, a storage 30 and a calculator 40.

An XYZ orthogonal coordinate system is shown in FIG. 1 and figures to be described later. An XY plane is a plane parallel to a light receiving surface of the photoelectric conversion element 20 and a Z direction is a direction orthogonal to the XY plane.

In FIG. 1 and the figures to be described later, an intersection of two dashed-dotted lines in a plan view indicates a center of the XY plane; one dashed-dotted line is parallel to an X direction and the other dashed-dotted line is parallel to a Y direction. An intersection of two dotted lines in the plan view indicates a center of the spot size of incident light on the XY plane; one dotted line is parallel to the X direction and the other dotted line is parallel to the Y direction.

The photoelectric conversion element 20 generates a current corresponding to the intensity of incident light incident on the first sensitive part 21 (to be described in detail later). The photoelectric conversion element 20 distributes and outputs the current generated in the first sensitive part 21 to four electrode layers 223 (and electrode layers 233 on the back surface side to be described later) arranged on four sides according to the center position (coordinates) (hereinafter, also referred to as an XY position) of the incident light on the light receiving surface (XY plane). In addition, the photoelectric conversion element 20 generates a current corresponding to the intensity of incident light incident on the second sensitive part 22 (to be described in detail later). The photoelectric conversion element 20 distributes and outputs the current generated in the first sensitive part 21 to four electrode layers 224 (and electrode layers 234 on the back surface side to be described later) arranged on four corners according to the center position (coordinates) (hereinafter, also referred to as an XY position) of the incident light on the light receiving surface (XY plane).

In this manner, the photoelectric conversion element 20 generates a current corresponding to the intensity (total amount) of incident light as the sum of the currents of the four pairs of electrode layers 223, 233 of the first sensitive part 21 and the currents of the four pairs of electrode layers 224, 234 of the second sensitive part 22. In addition, in each of the four pairs of electrode layers 224, 234 of the second sensitive part 22, the photoelectric conversion element 20 generates a current corresponding to the XY position (coordinates) of the incident light on the light receiving surface. In addition, in each of the four pairs of electrode layers 223, 233 of the first sensitive part 21, the photoelectric conversion element 20 generates a current corresponding to the XY position (coordinates) of the incident light on the light receiving surface. In addition, as the sum of the currents of the four pairs of electrode layers 223, 233 of the first sensitive part 21, the photoelectric conversion element 20 generates a current corresponding to the density of the incident light, in other words, a current corresponding to the spot size of the incident light. The configuration of the photoelectric conversion element 20 is described in detail later.

The storage 30 stores in advance a table in which an output current (total amount) of the first sensitive part 21 and the second sensitive part 22 of the photoelectric conversion element 20 (that is, the intensity (total amount) of incident light on the photoelectric conversion element 20) and an output current (total amount) of the first sensitive part 21 of the photoelectric conversion element 20 (that is, the intensity of incident light on the first sensitive part 21 of the photoelectric conversion element 20) are associated with the spot size of the incident light on the light receiving surface of the photoelectric conversion element 20 for each XY position (coordinates) of the incident light on the light receiving surface of the photoelectric conversion element 20. The storage 30 is a rewritable memory such as an EEPROM.

The calculator 40 calculates and detects the intensity (total amount) of the incident light according to the total amount of the currents output from the four electrode layers 223 (233) of the first sensitive part 21 of the photoelectric conversion element 20 and the currents output from the four electrode layers 224 (234) of the second sensitive part 22 of the photoelectric conversion element 20.

The calculator 40 also calculates and detects the XY position (coordinates) of the incident light on the light receiving surface of the photoelectric conversion element 20 based on a ratio of the currents output from each of the four electrode layers 224 (234) of the second sensitive part 22 of the photoelectric conversion element 20. In addition, the calculator 40 may calculate and detect the XY position (coordinates) of the incident light on the light receiving surface of the photoelectric conversion element 20 based on a ratio of currents output from each of the four electrode layers 223 (233) of the first sensitive part 21 of the photoelectric conversion element 20.

The calculator 40 also refers to the table stored in the storage 30 and obtains and detects the spot size of the incident light on the light receiving surface of the photoelectric conversion element 20 corresponding to the total amount of the currents output from the eight electrode layers 223 (233) and 224 (234) of the photoelectric conversion element 20 (i.e. the intensity (total amount) of the incident light on the photoelectric conversion element 20) and the total amount of the currents output from the four electrode layers 223 (233) of the photoelectric conversion element 20 (i.e. the intensity of the incident light on the first sensitive part 21 of the photoelectric conversion element 20) at the XY position (coordinates) of the incident light on the light receiving surface of the photoelectric conversion element 20.

The calculator 40 is constituted by an arithmetic processor such as a DSP (Digital Signal Processor) or an FPGA (Field-Programmable Gate Array). Various functions of the calculator 40 are realized, for example, by executing a predetermined software (program, application) stored in the storage 30. Various functions of the calculator 40 may be realized by the cooperation of a hardware and a software or may be realized only by a hardware (electronic circuit). The configurations of the photoelectric conversion element 20 are described in detail below.

Photoelectric Conversion Element

Figure 2:
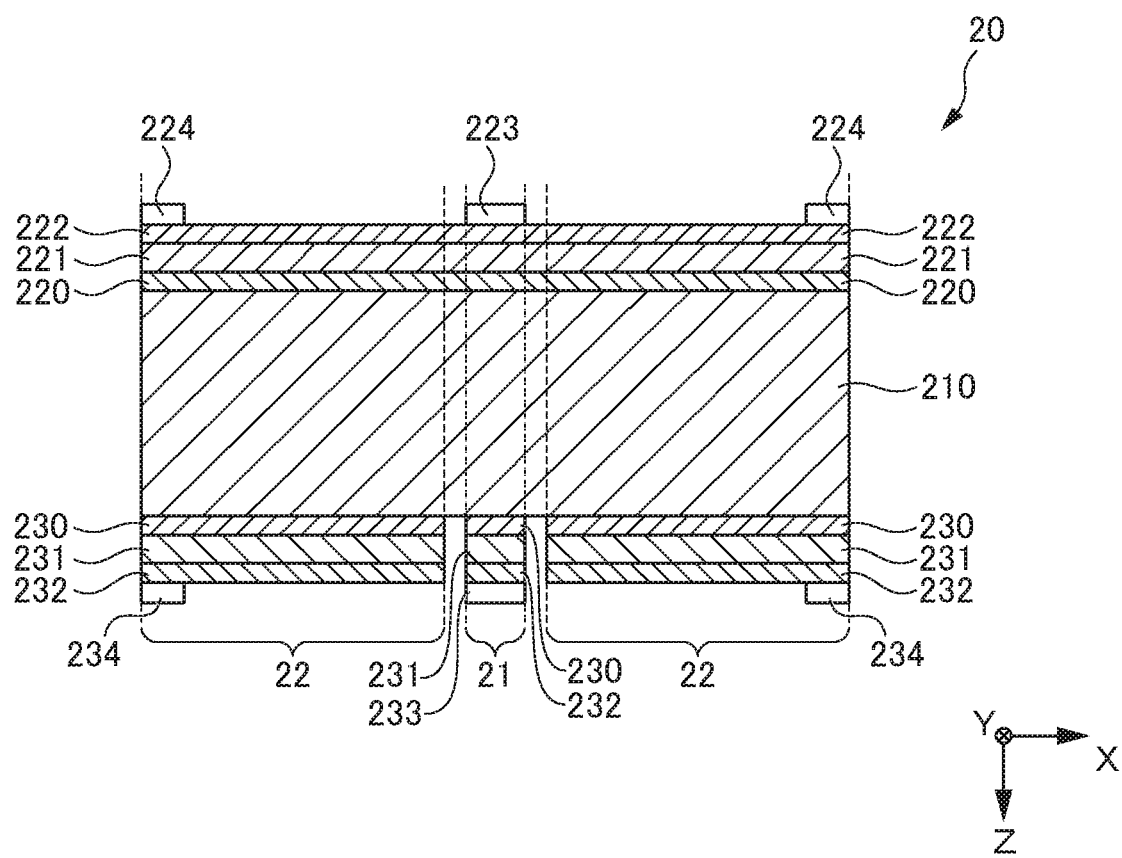
FIG. 2 is a cross-sectional view taken along line II-II of the photoelectric conversion element of FIG. 1.

FIG. 2 is a cross-sectional view along line II-II of the photoelectric conversion element 20 of FIG. 1. The photoelectric conversion element 20 is provided with an n-type (second conductivity type) semiconductor substrate (photoelectric conversion substrate) 210 having two principal surfaces, and a passivation layer 220, a p-type (first conductivity type) semiconductor layer 221, a transparent electrode layer 222, an electrode layer (first electrode) 223 and an electrode layer (second electrode) 224 successively laminated on a light receiving surface side, which is one principal surface on a light receiving side, out of the principal surfaces of the semiconductor substrate 210. In addition, the photoelectric conversion element 20 includes a passivation layer 230, an n-type (second conductivity type) semiconductor layer 231, a transparent electrode layer 232, an electrode layer (first electrode) 233, and an electrode layer (second electrode) 234 that are sequentially laminated on a first specific region and a second specific region on the side of the back surface that is the other principal surface on a side opposite to the light receiving surface between the principal surfaces of the semiconductor substrate 210.

A laminated part in this first specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a first sensitive part 21. A laminated part in the second specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a second sensitive part 22.

The semiconductor substrate (photoelectric conversion substrate) 210 is formed of a crystalline silicon material such as single-crystal silicon or multi-crystal silicon. The semiconductor substrate 210 is, for example, an n-type semiconductor substrate in which the crystalline silicon material is doped with an n-type dopant. Examples of the n-type dopant may include phosphorus (P). By using the crystalline silicon as the material of the semiconductor substrate 210, a dark current is relatively small, and an S/N ratio is relatively high and sensitivity is high (stable response without depending on illuminance) even if the intensity of the incident light is low.

The passivation layer 220 is continuously formed on the entire light receiving surface of the semiconductor substrate 210. On the other hand, the passivation layer 230 is formed so as to be separated between the first sensitive part 21 and the second sensitive part 22 on the back surface side of the semiconductor substrate 210. The passivation layers 220, 230 are, for example, formed of an intrinsic (i-type) amorphous silicon material. The passivation layers 220, 230 suppress the recombination of carriers generated in the first sensitive part 21 and the second sensitive part 22 of the semiconductor substrate 210 and enhance carrier recovery efficiency.

The p-type semiconductor layer 221 is continuously formed on the passivation layer 220, i.e. on the entire light receiving surface of the semiconductor substrate 210. The p-type semiconductor layer 221 is, for example, formed of an amorphous silicon material. The p-type semiconductor layer 221 is, for example, a p-type semiconductor layer in which the amorphous silicon material is doped with a p-type dopant. Examples of the p-type dopant may include boron (B).

The n-type semiconductor layer 231 is formed so as to be separated between the first sensitive part 21 and the second sensitive part 22 on the passivation layer 230, that is, on the back surface side of the semiconductor substrate 210. The n-type semiconductor layer 231 is, for example, formed of an amorphous silicon material. The n-type semiconductor layer 231 is, for example, an n-type semiconductor layer in which the amorphous silicon material is doped with an n-type dopant (e.g. phosphorus (P) described above). The aforementioned passivation layers 220, 230, p-type semiconductor layer 221 and n-type semiconductor layer 231 are formed, for example, using a CVD method.

The transparent electrode layer 222 is continuously formed on the p-type semiconductor layer 221, that is, on the entire light receiving surface of the semiconductor substrate 210. On the other hand, the transparent electrode layer 232 is formed so as to be separated between the first sensitive part 21 and the second sensitive part 22 on the n-type semiconductor layer 231, that is, on the back surface side of the semiconductor substrate 210. The transparent electrode layers 222, 232 are formed of a transparent conductive material. ITO (Indium Tin Oxide: complex oxide of indium oxide and tin oxide) or the like is given as an example of the transparent conductive material. The transparent electrode layers 222, 232 are formed, for example, using a sputtering method.

Four electrode layers 223 are independently formed on the respective four sides of the first sensitive part 21 on the transparent electrode layer 222, that is, on the light receiving surface side of the semiconductor substrate 210, and four electrode layers 233 are independently formed on the respective four sides of the first sensitive part 21 on the transparent electrode layer 232, that is, on the back surface side of the semiconductor substrate 210. Four electrode layers 224 are independently formed on the respective four corners of the second sensitive part 22 on the transparent electrode layer 222, that is, on the light receiving surface side of the semiconductor substrate 210, and four electrode layers 234 are independently formed on the respective four corners of the second sensitive part 22 on the transparent electrode layer 232, that is, on the back surface side of the semiconductor substrate 210. The electrode layers 223, 233, 224, and 234 are formed of a conductive paste material containing a metal powder, such as silver. The electrode layers 223, 233, 224 and 234 are formed, for example, using a printing method.

Figure 3:
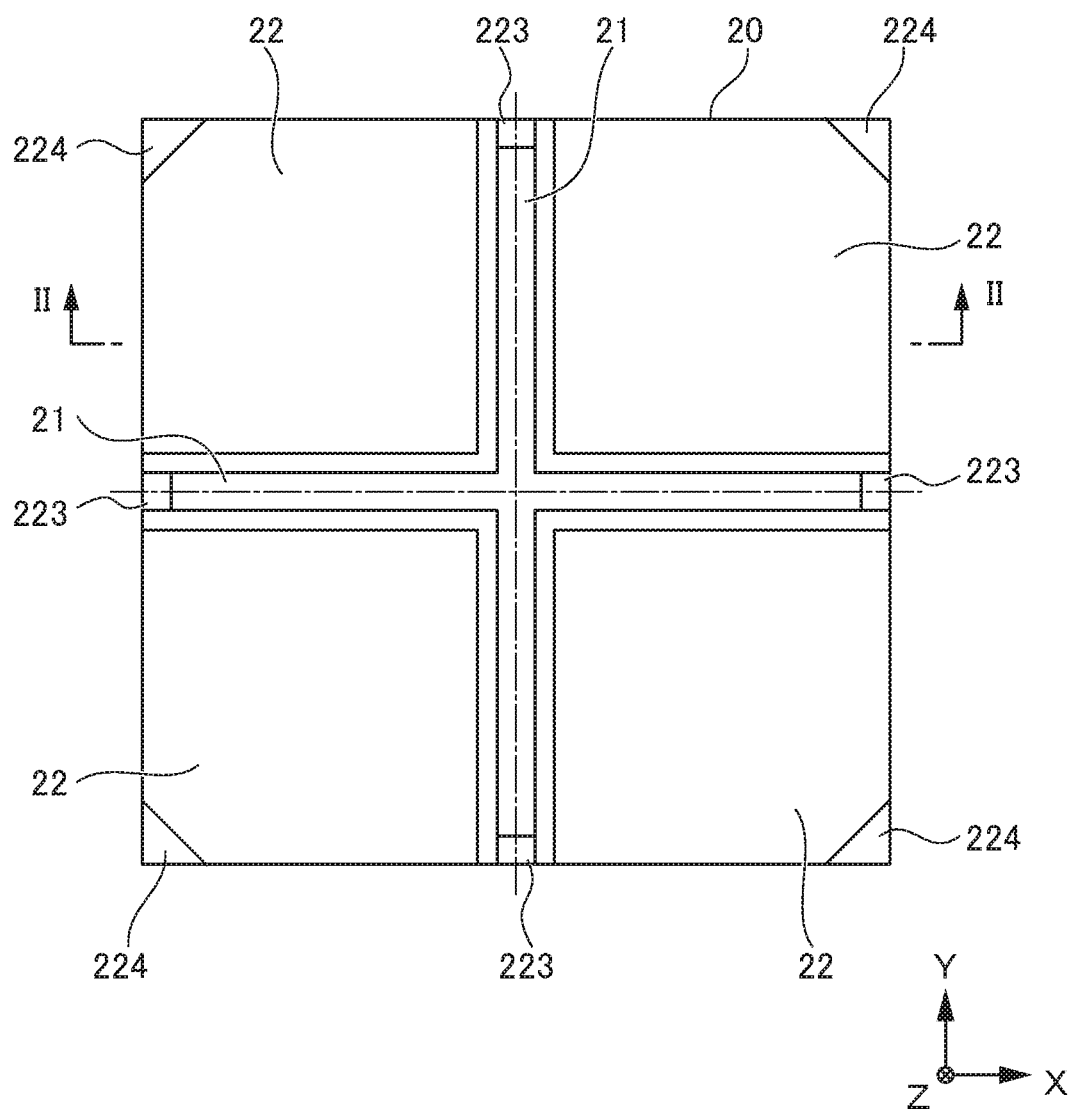
FIG. 3 is a view showing the photoelectric conversion element of FIGS. 1 and 2 from a light receiving surface side.

FIG. 3 is a view showing the layers 230, 231 and 232 on the back surface side of the semiconductor substrate 210 of the photoelectric conversion element 20 of FIGS. 1 and 2 from the light receiving surface side. As shown in FIGS. 2 and 3, the photoelectric conversion element 20 has the first sensitive part 21 and the second sensitive parts 22. Sensitive areas appearing on the both principal surfaces (light receiving surface and back surface) of the semiconductor substrate 210 in the first sensitive part 21 are first sensitive regions, and sensitive regions appearing on the both principal surfaces of the semiconductor substrate 210 in the second sensitive parts 22 are second sensitive regions.

As shown in FIGS. 2 and 3, the passivation layer 230, the n-type semiconductor layer 231, and the transparent electrode layer 232 that are formed on the back surface side of the semiconductor substrate 210 are separated between the first sensitive part 21 and the second sensitive part 22. On the other hand, the passivation layer 220, the p-type semiconductor layer 221, and the transparent electrode layer 222 that are formed on the light receiving surface side of the semiconductor substrate 210 are continuous between the first sensitive part 21 and the second sensitive part 22. That is, the passivation layer 220, the p-type semiconductor layer 221, and the transparent electrode layer 222 are formed on the entire light receiving surface of the semiconductor substrate 210. Thus, optical characteristics (e.g. reflection characteristic) become uniform on the light receiving surface side.

The photoelectric conversion characteristics (sensitivity) of the first sensitive part 21 and the photoelectric conversion characteristics (sensitivity) of the second sensitive part 22 may be the same or different.

Figure 4:
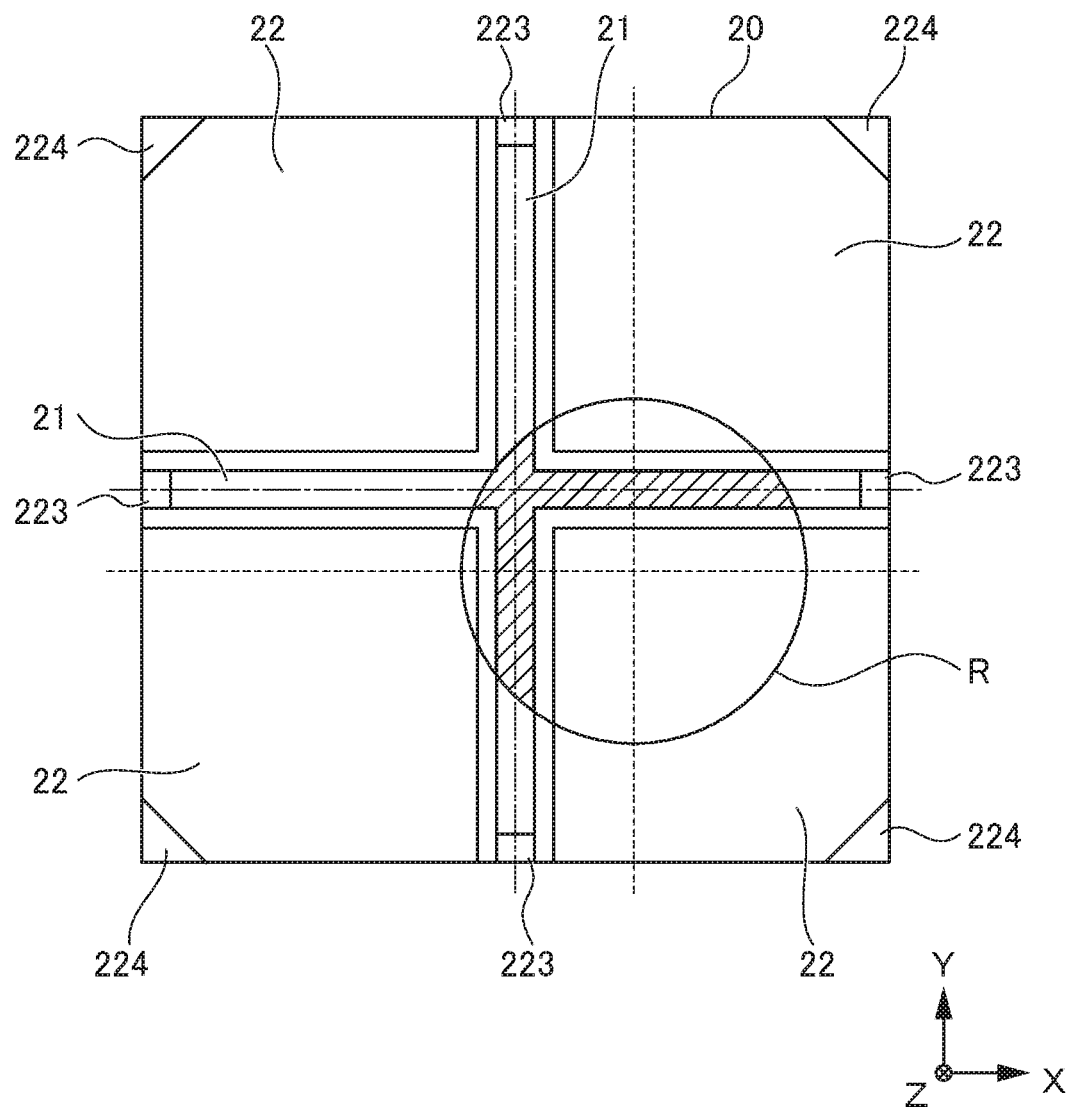
FIG. 4 is a view showing a state where incident light is incident on the photoelectric conversion element of FIG. 3.

The first sensitive region on the back surface side of the first sensitive part 21 radially extends in the X and Y directions from a center of the light receiving surface and forms strip-like patterns orthogonal to each other. The strip-like patterns in the first sensitive region of the first sensitive part 21 have a constant width. Thus, as the irradiation region R irradiated with the incident light on the light receiving surface increases (i.e. as the density of the incident light decreases) as shown in FIG. 4, a ratio of the first sensitive part 21 (first sensitive region) to the second sensitive parts 22 (second sensitive regions) in the irradiation region R becomes smaller. Therefore, an output current of the first sensitive region 21 decreases as the spot size of the incident light on the light receiving surface increases.

Table

Next, an example of a method for creating the table stored in the storage 30 is described. The table may be created through actual measurements or may be created using an approximate calculation as described below.

Figure 5:
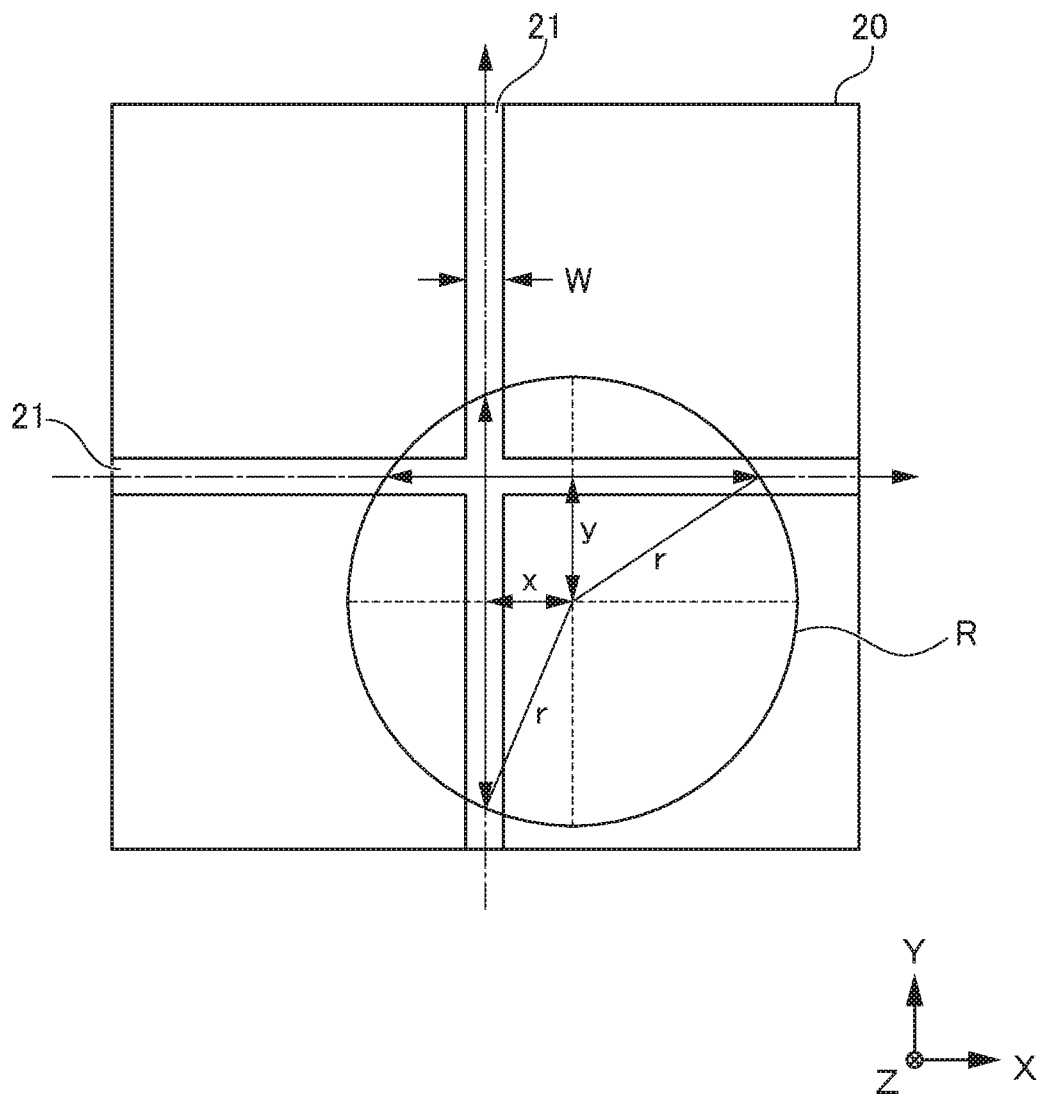
FIG. 5 is a view showing an approximate calculation of an overlap of an irradiation region of the incident light and a first sensitive part on a light receiving surface of the photoelectric conversion element.

FIG. 5 is a view showing an approximate calculation of an overlap of the irradiation region R of incident light on the light receiving surface of the photoelectric conversion element 20 and the first sensitive part 21 (first sensitive region). As shown in FIG. 5, if it is assumed that (x, y) denotes a deviation amount of a center position of the irradiation region R of the incident light from the center position of the light receiving surface of the photoelectric conversion element 20, r denotes a radius of the irradiation region R of the incident light, w denotes the width of the strip-like patterns of the first sensitive part 21 (first sensitive region) and r»w, an overlap of the irradiation region R of the incident light and a part of the first sensitive part 21 (first sensitive region) extending in the X direction is obtained by the following equation.

$$2 \times w \times \sqrt{(r^2 - y^2)}$$

An overlap of the irradiation region R of the incident light and a part of the first sensitive part 21 (first sensitive region) extending in the Y direction is obtained by the following equation.

$$2 \times w \times \sqrt{(r^2 - x^2)}$$

Thus, the overlap of the irradiation region R of the incident light and the first sensitive part 21 (first sensitive region) is obtained by the following equation.

$$2 \times w \times \sqrt{(r^2 - y^2)} + 2 \times w \times \sqrt{(r^2 - x^2)} - w^2$$

The table may be created using this approximate calculation.

FIG. 6A is a graph showing an example of characteristics of the detection intensity of the incident light in relation to the radius of the irradiation region R of the incident light with the photoelectric conversion element 20. The characteristics when the deviation amount (x [cm], y [cm]) of the center position of the irradiation region R of the incident light from the center position of the light receiving surface is (0, 0), (0.01, 0.01), (0.02, 0.02), (0.03, 0.03), (0.04, 0.04) and (0.05, 0.05) are shown in FIG. 6A. FIG. 6B is a graph enlargedly showing a part (part enclosed by a two-dot chain line) of the characteristic when the deviation amount (x [cm], y [cm]) of the center position of the irradiation region R of the incident light is (0.05, 0.05) in FIG. 6A. As shown in FIGS. 6A and 6B, the detection intensity of the incident light has a local maximum value depending on the center position of the irradiation region R of the incident light (spot center coordinates) if r»w is not satisfied. That is, there are two solutions (radii) for one detection intensity.

Figure 7A:
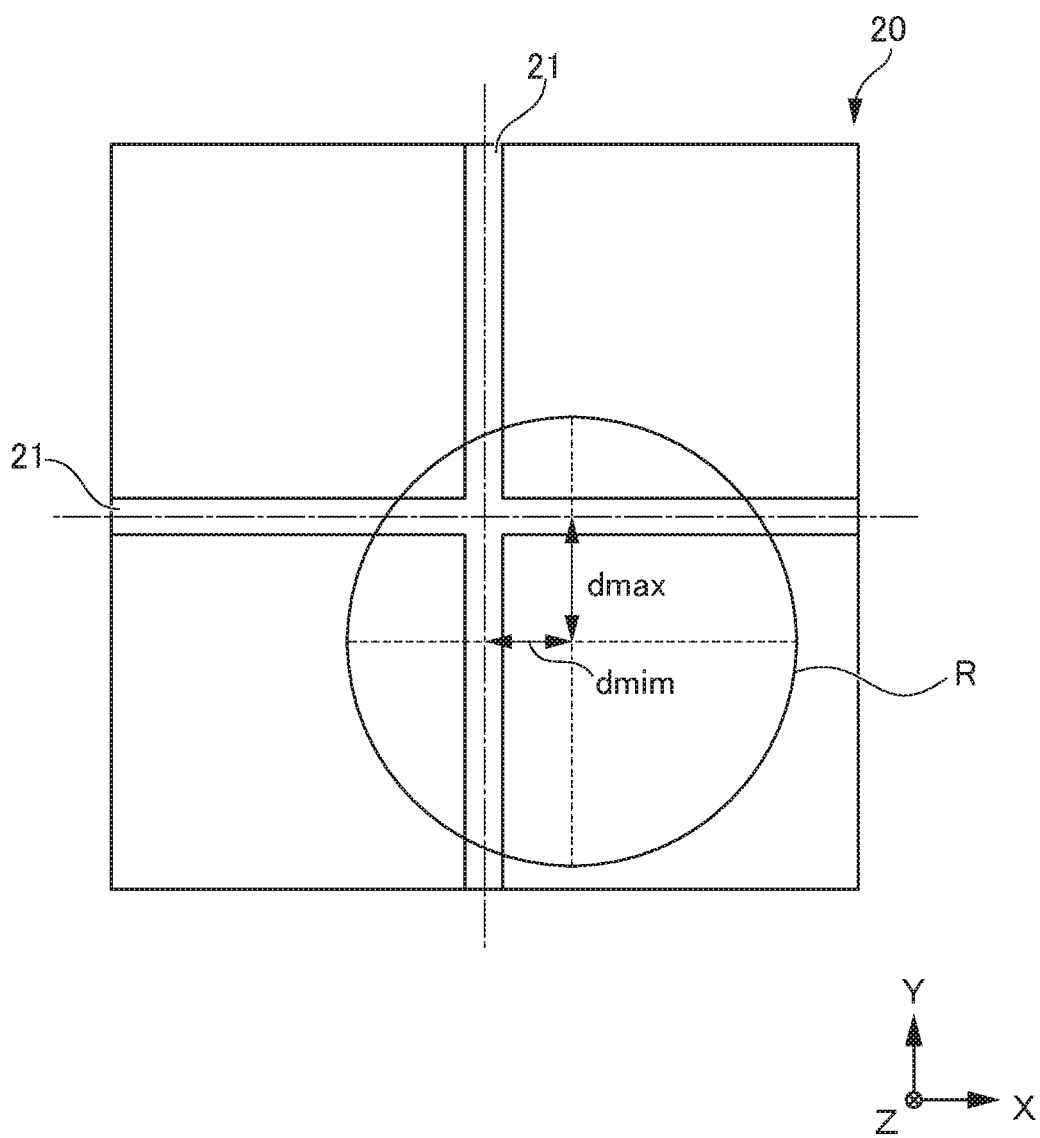
FIG. 7A is a view showing a deviation amount (dmin, dmax) of the center position of the irradiation region of the incident light from a center position of a light receiving surface.

Accordingly, as shown in FIG. 7A, the radius r of the irradiation region R of the incident light may be adjusted to satisfy the following equation based on dmax, which is the larger one of dmin and dmax, when the deviation amount (x, y) of the center position of the irradiation region R of the incident light from the center position of the light receiving surface is (dmin, dmax). For example, the arrangement of the photoelectric conversion element 20 or the type (curvature) of an optical lens used in combination with the photoelectric conversion device 1 may be adjusted.

$$r > d_{max} \times \sqrt{(2)}$$

For example, if the deviation amount dmax of the center position of the irradiation region R of the incident light from the center position of the light receiving surface is 0.05 cm as shown in FIG. 6B, the radius r of the irradiation region R of the incident light is adjusted to be 0.71 cm or longer.

Figure 7B:
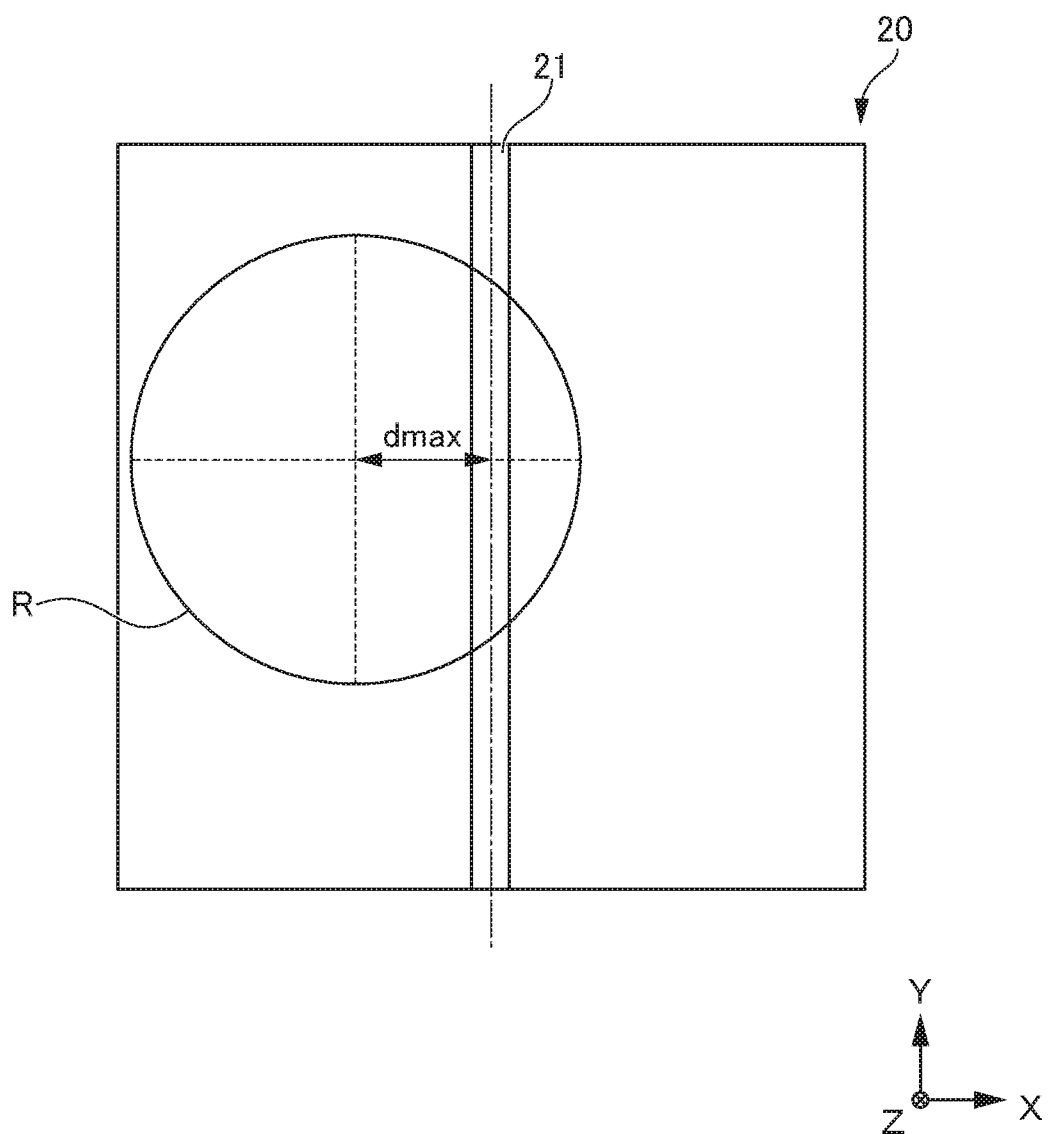
FIG. 7B is a view showing a deviation amount dmax in an X direction of the center position of the irradiation region of the incident light from the center position in the X direction of the light receiving surface.

If the first sensitive part 21 (first sensitive region) of the photoelectric conversion element 20 is formed by one strip-like pattern passing through the center of the light receiving surface and extending in the Y direction as shown in FIG. 7B (to be described later with reference to FIG. 9A), dmax in the above equation may be a deviation amount in the X direction of the center position of the irradiation region R of the incident light from the center position of the light receiving surface in the X direction.

As described above, the photoelectric conversion element 20 generates a current corresponding to the intensity of incident light incident on the first sensitive part 21 in the photoelectric conversion device 1 of this embodiment. The photoelectric conversion element 20 distributes and outputs the generated current to four pairs of the electrode layers 223, 233 arranged on the four sides according to the XY position (coordinates) of the center of the incident light on the light receiving surface (XY plane). The photoelectric conversion element 20 generates a current corresponding to the intensity of incident light incident on the second sensitive part 22. The photoelectric conversion element 20 distributes and outputs the generated current to four pairs of the electrode layers 224, 234 arranged on the four corners according to the XY position (coordinates) of the center of the incident light on the light receiving surface (XY plane).

In this manner, the photoelectric conversion element 20 generates a current corresponding to the intensity (total amount) of incident light as the sum of the currents of the four pairs of electrode layers 223, 233 of the first sensitive part 21 and the currents of the four pairs of electrode layers 224, 234 of the second sensitive part 22. In addition, in each of the four pairs of electrode layers 224, 234 of the second sensitive part 22, the photoelectric conversion element 20 generates a current corresponding to the XY position (coordinates) of the incident light on the light receiving surface. In addition, in each of the four pairs of electrode layers 223, 233 of the first sensitive part 21, the photoelectric conversion element 20 generates a current corresponding to the XY position (coordinates) of the incident light on the light receiving surface. In addition, as the sum of the currents of the four pairs of electrode layers 223, 233 of the first sensitive part 21, the photoelectric conversion element 20 generates a current corresponding to the density of the incident light, in other words, a current corresponding to the spot size of the incident light.

The calculator 40 calculates and detects the intensity (total amount) of the incident light according to the total amount of the currents output from the four pairs of electrode layers 223, 233 of the first sensitive part 21 of the photoelectric conversion element 20 and the currents output from the four pairs of electrode layers 224, 234 of the second sensitive part 22 of the photoelectric conversion element 20.

In addition, the calculator 40 calculates and detects the XY position (coordinates) of the incident light on the light receiving surface of the photoelectric conversion element 20 based on the ratio of the current output from each of the four pairs of electrode layers 224, 234 of the second sensitive part 22 of the photoelectric conversion element 20 (or the ratio of the current output from each of the four pairs of electrode layers 223, 233 of the first sensitive part 21 of the photoelectric conversion element 20).

The calculator 40 also refers to the table stored in the storage 30 and obtains and detects the spot size of the incident light on the light receiving surface of the photoelectric conversion element 20 corresponding to the total amount of the currents output from the eight pairs of the electrode layers 223, 233, 224 and 234 of the photoelectric conversion element 20 (i.e. the intensity (total amount) of the incident light on the photoelectric conversion element 20) and the total amount of the currents output from the four pairs of the electrode layers 223, 233 of the photoelectric conversion element 20 (i.e. the intensity of the incident light on the first sensitive part 21 of the photoelectric conversion element 20) at the XY position (coordinates) of the incident light on the light receiving surface of the photoelectric conversion element 20.

Figure 8:
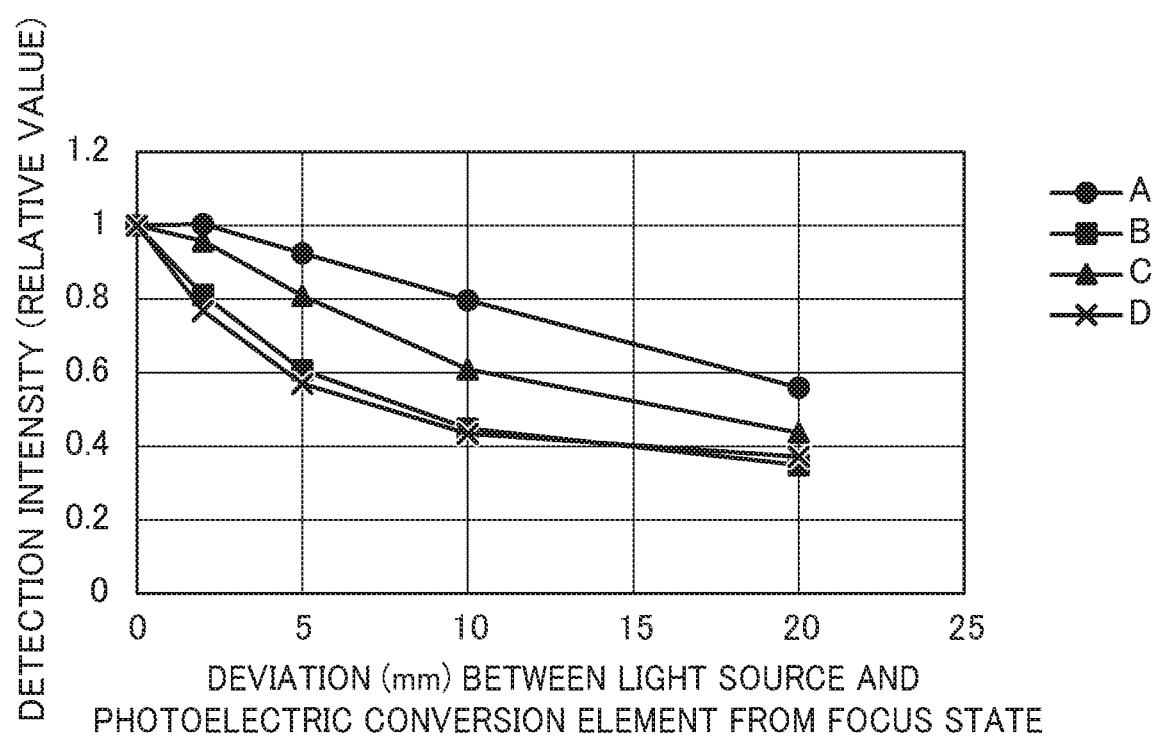
FIG. 8 is a graph showing an example of detection intensities (relative values) of the incident light with the photoelectric conversion element when a light source is moved away from the photoelectric conversion element from a state where the incident light from the light source is focused on the light receiving surface of the photoelectric conversion element (0 mm on a horizontal axis)
Figure 9A:
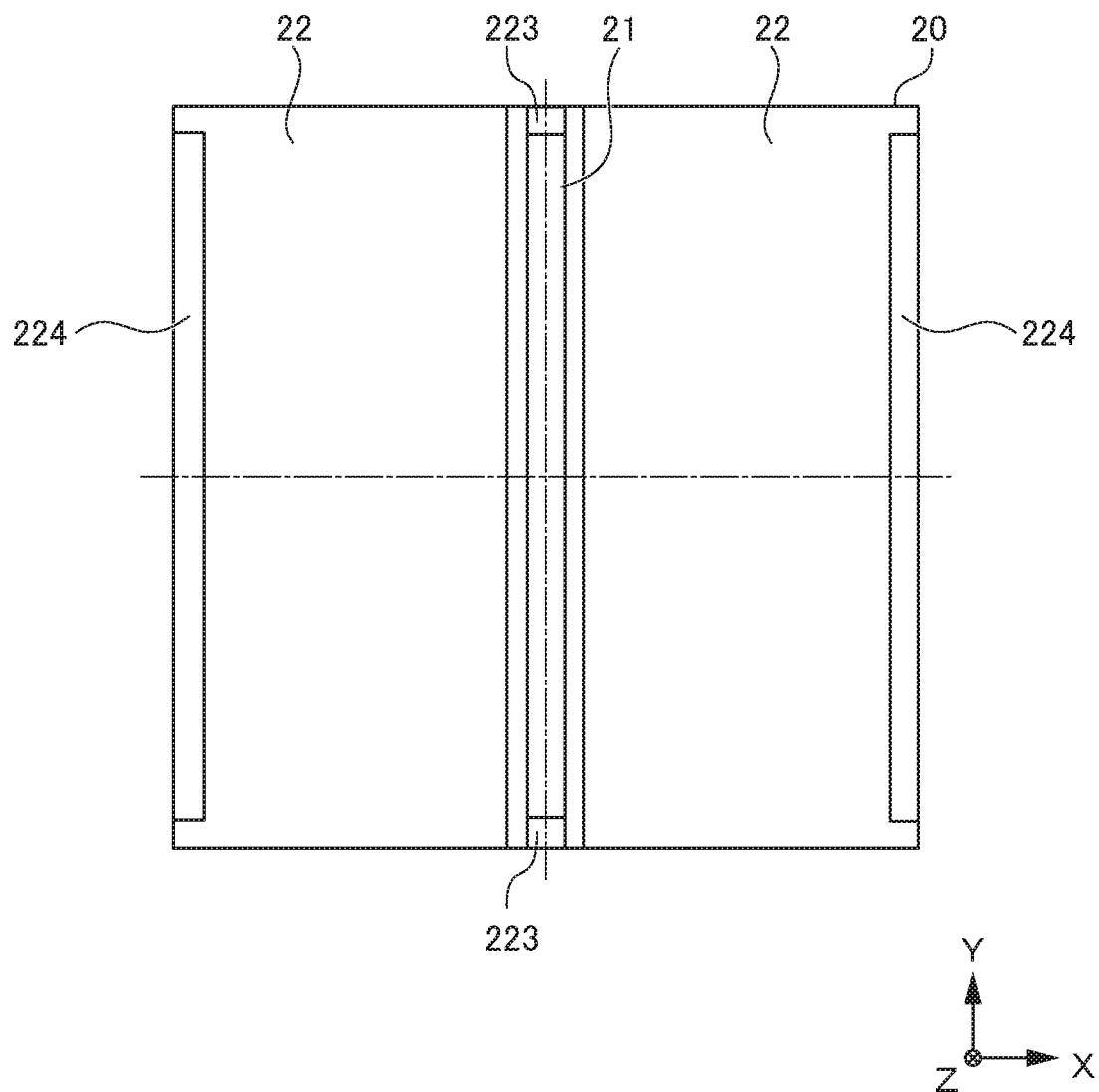
FIG. 9A is a view showing a modification of a pattern of a first sensitive region of the first sensitive part of the photoelectric conversion element.

FIG. 8 is a graph showing an example of detected intensities (relative values) of incident light with the first sensitive part 21 in the photoelectric conversion element 20 when the light source is moved away from the photoelectric conversion element 20 from a state where the incident light (wavelength of 940 nm) from the light source is focused on the light receiving surface of the photoelectric conversion element 20 (0 mm on a horizontal axis). FIG. 8 shows characteristics A, B and C when the first sensitive region of the first sensitive part 21 forms strip-like patterns radially extending in the X and Y directions from the center of the light receiving surface and orthogonal to each other as shown in FIG. 3 and the width thereof is 1.5 mm, 1.0 mm and 0.5 mm respectively, and a characteristic D when the first sensitive region of the first sensitive part 21 forms a strip-like pattern passing through the center of the light receiving surface and extending in the Y direction as shown in FIG. 9A and the width thereof is 0.5 mm.

According to the characteristic A, it is understood that a more linear detection characteristic is obtained even if a detection distance is long as the patterns in the first sensitive region of the first sensitive part 21 become wider. Further, according to the characteristics C and D, it is understood that a more linear detection characteristic is obtained when the detection distance is short as the patterns in the first sensitive region of the first sensitive part 21 become narrower. From these results, it is understood that the wide patterns in the first sensitive region of the first sensitive part 21 are suitable for long-distance light detection and the narrow patterns in the first sensitive region of the first sensitive part 21 are suitable for short-distance light detection.

Modification of the First Embodiment

In the present embodiment, the form is illustrated in which the passivation layer 230, the n-type semiconductor layer 231, and the transparent electrode layer 232 that are sequentially formed on the back surface side of the photoelectric conversion element 20 are separated between the first sensitive part 21 and the second sensitive part 22. However, the present disclosure is not limited to this. The photoelectric conversion element 20 may be formed such that a passivation layer, a conductivity type semiconductor layer, and a transparent electrode layer of the first sensitive part 21 and a passivation layer, a conductivity type semiconductor layer, and a transparent electrode layer of the second sensitive part 22 are separated on at least one of the light receiving surface side and the back surface side. In other words, strip-like pattern(s) in the first sensitive part 21 (first sensitive region) may be formed on at least one of the light receiving surface side and the back surface side of the photoelectric conversion element 20.

For example, contrary to the aforementioned embodiment, strip-like pattern(s) of the first sensitive part 21 may be formed on the light receiving surface side of the photoelectric conversion element 20. More specifically, the passivation layer 230, the n-type semiconductor layer 231, and the transparent electrode layer 232 on the back surface side of the photoelectric conversion element 20 may be continuous between the first sensitive part 21 and the second sensitive part 22, and the passivation layer 220, the p-type semiconductor layer 221, and the transparent electrode layer 222 on the light receiving surface side of the photoelectric conversion element 20 may be separated between the first sensitive part 21 and the second sensitive part 22. In addition, for example, a strip-like pattern of the first sensitive part 21 may be formed on the light receiving surface side and the back surface side of the photoelectric conversion element 20. More specifically, the passivation layer 220, the p-type semiconductor layer 221, and the transparent electrode layer 222 on the light receiving surface side of the photoelectric conversion element 20 may be separated between the first sensitive part 21 and the second sensitive part 22, and the passivation layer 230, the n-type semiconductor layer 231, and the transparent electrode layer 232 on the back surface side of the photoelectric conversion element 20 may also be separated between the first sensitive part 21 and the second sensitive part 22. In this case, optical characteristics (e.g. reflection characteristic) on the light receiving surface may be separately adjusted.

In addition, a transparent electrode layer may be formed in a portion between the first sensitive part 21 and the second sensitive part 22 of the photoelectric conversion element 20. In particular, when the passivation layer 220, the p-type semiconductor layer 221, and the transparent electrode layer 222 on the light receiving surface side of the photoelectric conversion element 20 are separated, if the transparent electrode layer is formed, the optical characteristics (for example, reflection characteristics) on the light receiving surface side are improved.

An optical sensor is provided with a pan (swing in a horizontal (lateral) direction) mechanism or a tilt (swing in a vertical (up-down) direction) mechanism in some cases. For example, in the case of applying the photoelectric conversion device 1 of this embodiment to an optical sensor provided with the pan mechanism, the first sensitive region of the first sensitive part 21 of the photoelectric conversion element 20 may be formed by one strip-like pattern passing through the center of the light receiving surface and extending in the Y direction as shown in FIG. 9A. In this case, since the incident light is adjusted to be located at a center of the light receiving surface in the X direction by the pan mechanism, the photoelectric conversion element 20 and the calculator 40 may detect the position of the incident light in the Y direction. The position of the incident light in the X direction is obtained from an angle of the pan mechanism. On the other hand, in the case of applying the photoelectric conversion device 1 of this embodiment to an optical sensor provided with the tilt mechanism, the first sensitive region of the first sensitive part 21 of the photoelectric conversion element 20 may be formed by one strip-like pattern passing through the center of the light receiving surface and extending in the X direction. In this case, since the incident light is adjusted to be located at a center of the light receiving surface in the Y direction by the tilt mechanism, the photoelectric conversion element 20 and the calculator 40 may detect the position of the incident light in the X direction. The position of the incident light in the Y direction is obtained from an angle of the tilt mechanism.

In the case of applying the photoelectric conversion device 1 of this embodiment to an optical sensor provided with the pan mechanism and the tilt mechanism, the incident light is adjusted to be located at a center of the light receiving surface in the X and Y directions by the pan mechanism and the tilt mechanism. Thus, the photoelectric conversion element 20 and the calculator 40 may not detect the positions of the incident light in the X and Y directions. The positions of the incident light in the X and Y directions are obtained from the angles of the pan mechanism and the tilt mechanism.

Figure 9B:
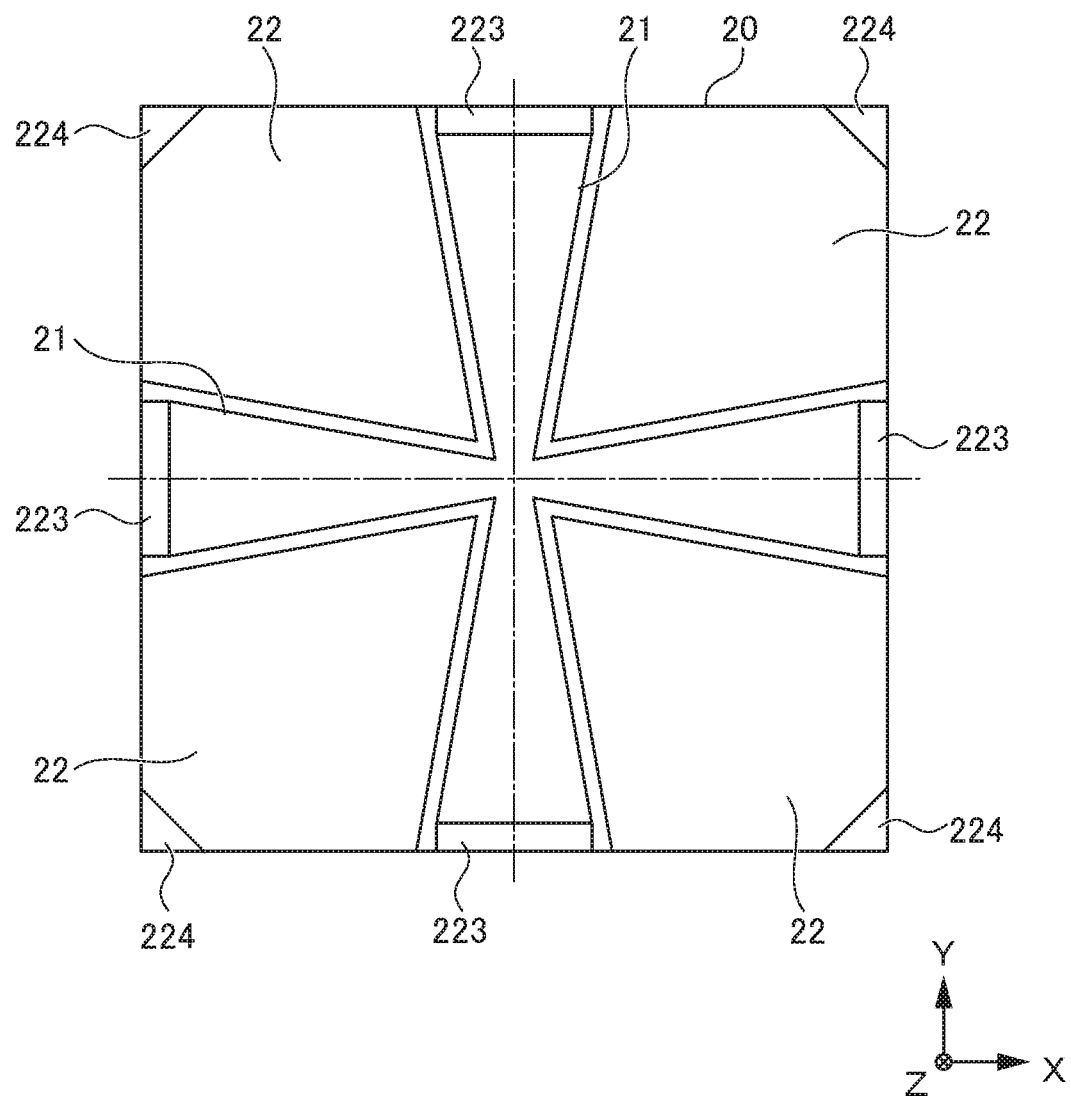
FIG. 9B is a view showing a modification of a pattern of a first sensitive region of the first sensitive part of the photoelectric conversion element.

In the case of applying the photoelectric conversion device 1 of this embodiment to the optical sensor provided with the pan mechanism and the tilt mechanism, the first sensitive region of the first sensitive part 21 of the photoelectric conversion element 20 may be formed by patterns gradually widened along the X and Y directions from the center of the light receiving surface as shown in FIG. 9B. In this case, a change of the output current due to a change of the spot size becomes linear. In contrast, if the first sensitive region of the first sensitive part 21 of the photoelectric conversion element 20 is formed by patterns having a constant width along the X and Y directions from the center of the light receiving surface as shown in FIG. 3, calculation in the calculator 40 is easy.

In this embodiment, the first sensitive region of the first sensitive part 21 of the photoelectric conversion element 20 may be formed by three or more strip-like patterns radially extending from the center of the light receiving surface. The first sensitive region of the first sensitive part 21 of the photoelectric conversion element 20 may also be formed by a plurality of island-like (dot-like) patterns. In this case, the density of the island-like patterns may change as the island-like patterns radially spread from the center of the light receiving surface or the size of the island-like patterns may change as the island-like patterns radially spread from the center of the light receiving surface. In this case, the island-like patterns radially spreading from the center of the light receiving surface may be electrically connected, and connected to the electrode layer. The first sensitive region of the first sensitive part 21 of the photoelectric conversion element 20 may also be formed by a lattice-like pattern. In this case, there are a plurality of intersections, and singularities where the output current increases when the center of the incident light approaches these intersections are expected to be created. Thus, the output current is preferably corrected at these singularities.

Second Embodiment

A three-dimensional sensor for detecting a position in a Z direction (depth) in addition to positions in X and Y directions (XY position) of a subject by causing diffused light from the subject to be incident thereon is known as an optical sensor. In such a three-dimensional sensor, if the position of the subject in the Z direction (depth) changes, the spot size of incident light incident on a photoelectric conversion element inside changes (defocusing).

Accordingly, if the aforementioned photoelectric conversion device 1 is applied to such a three-dimensional sensor, the position of the subject in the Z direction (depth) can be detected by detecting the spot size of incident light incident on the photoelectric conversion element. Then, the three-dimensional position of the subject can be detected from the incident direction of the incident light (a detailed calculation method will be described later) and the position in the Z direction (depth).

Figure 10:
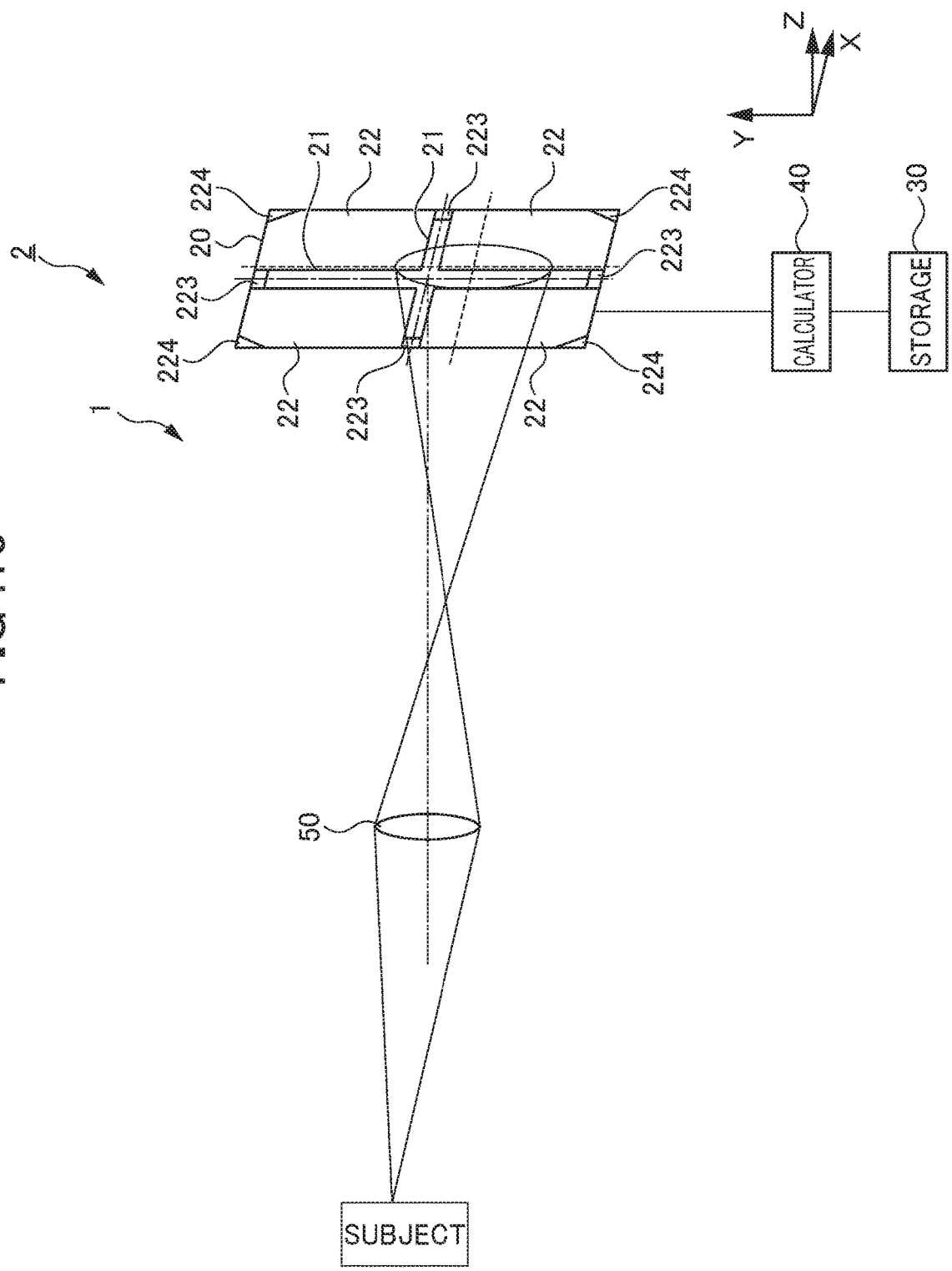
FIG. 10 is a view showing the configuration of a three-dimensional sensor according to a second embodiment.

FIG. 10 is a view showing the configuration of a three-dimensional sensor according to a second embodiment. The three-dimensional sensor 2 shown in FIG. 10 is provided with an optical lens 50 for condensing an optical image (diffused light) emitted from a subject, for example, by irradiating laser light to the subject, and the aforementioned photoelectric conversion device 1, on which the condensed light from the optical lens 50 is incident, i.e. the photoelectric conversion element 20, the storage 30 and the calculator 40.

The photoelectric conversion element 20 generates a current corresponding to the intensity of the incident light incident on the first sensitive part 21. The photoelectric conversion element 20 distributes and outputs the current generated in the first sensitive part 21 to the four pairs of electrode layers 223, 233 arranged on four sides according to the center position (XY position) of the incident light on the light receiving surface (XY plane). In addition, the photoelectric conversion element 20 generates a current corresponding to the intensity of the incident light incident on the second sensitive part 22. The photoelectric conversion element 20 distributes and outputs the current generated in the first sensitive part 21 to the four pairs of electrode layers 224, 234 arranged on four corners according to the center position (XY position) of the incident light on the light receiving surface (XY plane).

In this manner, the photoelectric conversion element 20 generates a current corresponding to the intensity (total amount) of incident light as the sum of the currents of the four pairs of electrode layers 223, 233 of the first sensitive part 21 and the currents of the four pairs of electrode layers 224, 234 of the second sensitive part 22. In addition, in each of the four pairs of electrode layers 224, 234 of the second sensitive part 22, the photoelectric conversion element 20 generates a current corresponding to the XY position (coordinates) of the incident light on the light receiving surface. In addition, in each of the four pairs of electrode layers 223, 233 of the first sensitive part 21, the photoelectric conversion element 20 generates a current corresponding to the XY position (coordinates) of the incident light on the light receiving surface. In addition, as the sum of the currents of the four pairs of electrode layers 223, 233 of the first sensitive part 21, the photoelectric conversion element 20 generates a current corresponding to the density of the incident light, in other words, a current corresponding to the spot size of the incident light.

The storage 30 stores in advance a table associating an output current (total amount) of the first sensitive part 21 and the second sensitive part 22 of the photoelectric conversion element 20 (i.e. the intensity (total amount) of incident light on the photoelectric conversion element 20) and an output current (total amount) of the first sensitive part 21 of the photoelectric conversion element 20 (i.e. the intensity of the incident light on the first sensitive part 21 of the photoelectric conversion element 20) with the spot size of the incident light on the light receiving surface of the photoelectric conversion element 20 for each XY position (coordinates) of the incident light on the light receiving surface of the photoelectric conversion element 20 and further associating the position of the subject in the Z direction (depth) with the spot size.

The calculator 40 calculates and detects the intensity (total amount) of the incident light according to the total amount of currents output from the four pairs of electrode layers 223, 233 of the first sensitive part 21 of the photoelectric conversion element 20 and currents output from the four pairs of electrode layers 224, 234 of the second sensitive part 22 of the photoelectric conversion element 20 as described above. In addition, as described above, the calculator 40 calculates and detects the XY position (coordinates) of the incident light on the light receiving surface of the photoelectric conversion element 20 based on the ratio of the current output from each of the four pairs of electrode layers 224, 234 of the second sensitive part 22 of the photoelectric conversion element 20 (or the ratio of the current output from each of the four pairs of electrode layers 223, 233 of the first sensitive part 21 of the photoelectric conversion element 20). Here, if the XY position (coordinates) of the center of the photoelectric conversion element 20 with respect to the XY position (coordinates) of the center of the optical lens 50 is known in advance, the calculator 40 calculates and detects the incident direction of the incident light from the XY position (coordinates) of the center of the optical lens 50 and the XY position (coordinates) of the incident light on the light receiving surface of the photoelectric conversion element 20.

In addition, referring to the table stored in the storage 30, the calculator 40 calculates and detects the spot size of the incident light on the light receiving surface of the photoelectric conversion element 20 and the position of the subject in the Z direction (depth) corresponding to the total amount of the currents output from the eight pairs of electrode layers 223, 233, 224, and 234 of the photoelectric conversion element 20 (that is, the intensity (total amount) of incident light of the photoelectric conversion element 20) and the total amount of the currents output from the four pairs of electrode layers 223, 233 of the photoelectric conversion element 20 (that is, the intensity of incident light on the first sensitive part 21 of the photoelectric conversion element 20) at the XY position (coordinates) of the incident light on the light receiving surface of the photoelectric conversion element 20. Then, the calculator 40 detects the three-dimensional position of the subject from the incident direction of the incident light and the position in the Z direction (depth) detected as described above.

Modification 1 of the Second Embodiment

A Three-Dimensional Sensor Having a Light Source Tracking Function (Two Axes)

The three-dimensional sensor 2 of the second embodiment described above may have a function of tracking a light source. The three-dimensional sensor 2 according to Modification 1 includes, for example, the above-described pan (swing in a horizontal (lateral) direction) mechanism or a tilt (swing in a vertical (up-down) direction) mechanism in order to track a light source.

Figure 11A:
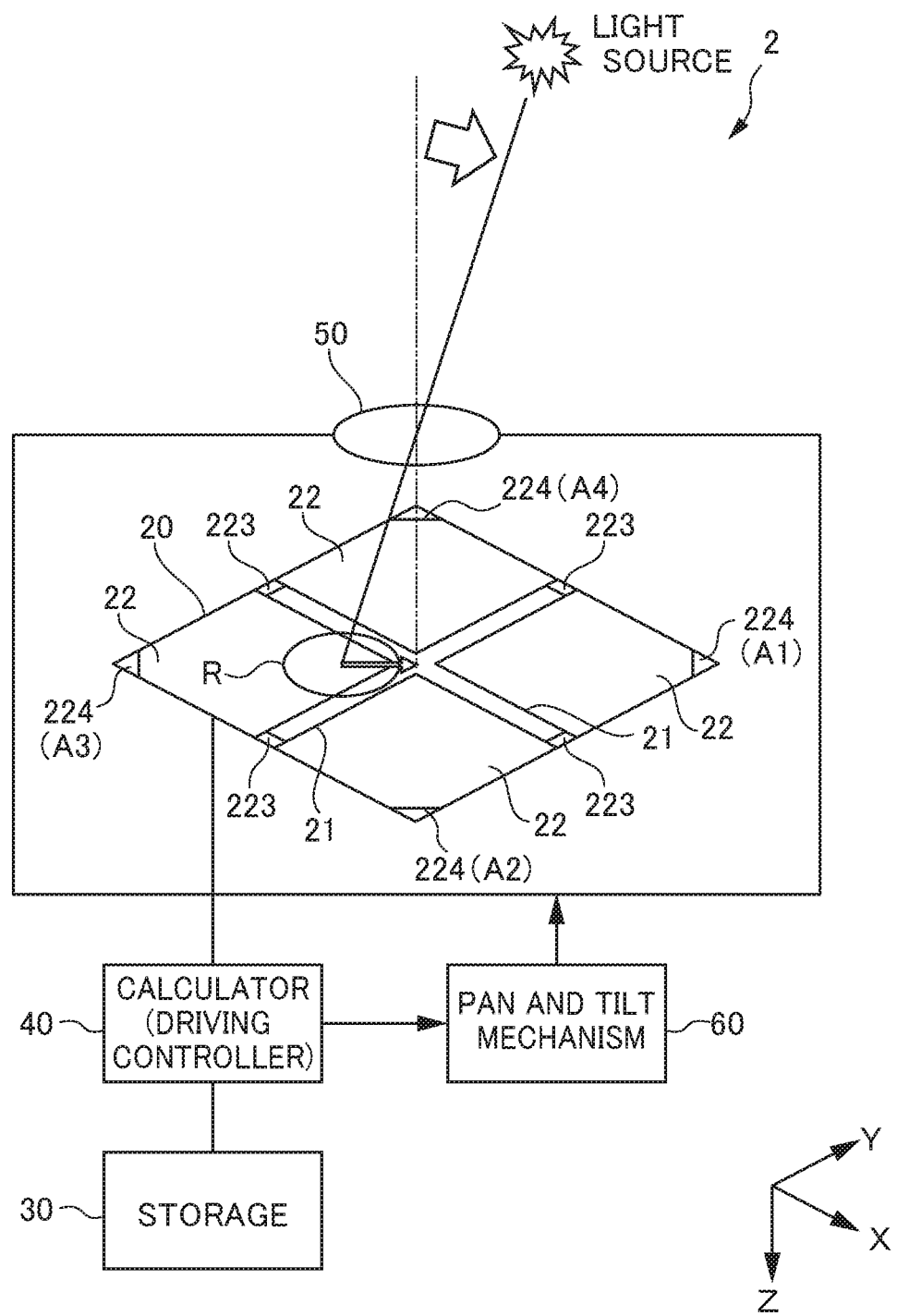
FIG. 11A is a view showing the configuration of a three-dimensional sensor 2 according to Modification 1 of the second embodiment (before light source tracking)
Figure 11B:
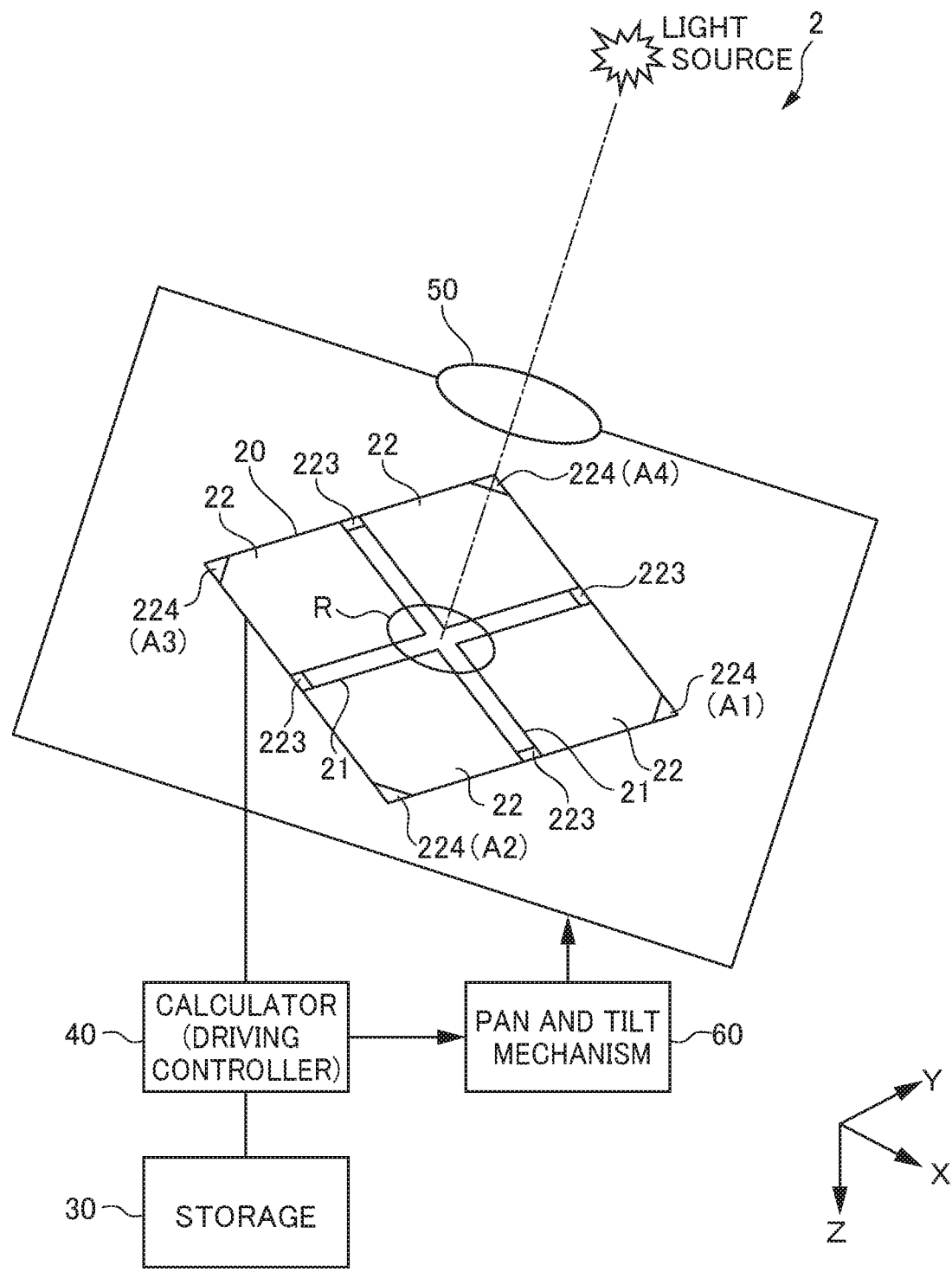
FIG. 11B is a view showing the configuration of a three-dimensional sensor 2 according to Modification 1 of the second embodiment (after light source tracking)

FIGS. 11A and 11B are views showing the configuration of the three-dimensional sensor 2 according to Modification 1 of the second embodiment. FIG. 11A shows a state before light source tracking, and FIG. 11B shows a state after light source tracking. As shown in FIGS. 11A and 11B, the three-dimensional sensor 2 of Modification 1 includes a pan and tilt mechanism (light source tracking mechanism) 60 in addition to the configuration of the three-dimensional sensor 2 of the second embodiment described above.

The calculator 40 functions as a driving controller for the pan and tilt mechanism 60, and generates a driving signal corresponding to a difference between output currents of the four pairs of electrode layers 224, 234 of the second sensitive part 22 of the photoelectric conversion element 20. The pan and tilt mechanism 60 has a driving unit, such as a motor, and changes the direction of each optical unit of the optical lens 50 and the photoelectric conversion element 20 according to the driving signal generated by the calculator 40.

For example, assuming that the output currents of the four pairs of electrode layers 224, 234 of the second sensitive part 22 are A1, A2, A3 and A4 in order in the circumferential direction, the calculator 40 generates a driving signal (tilt) corresponding to the difference between the output current (A1+A4) and the output current (A2+A3) of the electrode layers 224, 234 arranged opposite to the X axis. For example, in the case of (A1+A4)>(A2+A3), the pan and tilt mechanism 60 changes (tilts) the direction of the optical unit with respect to the X axis so that (A1+A4)=(A2+A3) is satisfied according to the driving signal corresponding to the difference between the output current (A1+A4) and the output current (A2+A3).

In addition, the calculator 40 generates a driving signal (pan) corresponding to the difference between the output current (A1+A2) and the output current (A3+A4) of the electrode layers 224, 234 arranged opposite to the Y axis. For example, in the case of (A1+A2)>(A3+A4), the pan and tilt mechanism 60 changes (pans) the direction of the optical unit with respect to the Y axis so that (A1+A2)=(A3+A4) is satisfied according to the driving signal corresponding to the difference between the output current (A1+A2) and the output current (A3+A4).

In this manner, the pan and tilt mechanism 60 can track the light source so that the center position (XY position) of the irradiation region R of the incident light on the light receiving surface of the photoelectric conversion element 20 becomes closer to the center position (XY position) of the photoelectric conversion element 20, that is, the center position (XY position) of the first sensitive part 21, by reducing the difference between the output currents of the four pairs of electrode layers 224, 234 of the second sensitive part 22 of the photoelectric conversion element 20.

According to the three-dimensional sensor 2 of Modification 1, even if the irradiation region R of the incident light on the light receiving surface of the photoelectric conversion element 20 is out of the first sensitive part 21, the center position (XY position) of the irradiation region R can be made closer to the center position (XY position) of the first sensitive part 21. As a result, the accuracy of the three-dimensional position detection of the light source is improved.

Modification 2 of the Second Embodiment

A Three-Dimensional Sensor having a Light Source Tracking Function (One Axis)

The three-dimensional sensor 2 according to Modification 2 includes, for example, one of the above-described pan (swing in a horizontal (lateral) direction) mechanism and the above-described tilt (swing in a vertical (up-down) direction) mechanism in order to track a light source.

Figure 12A:
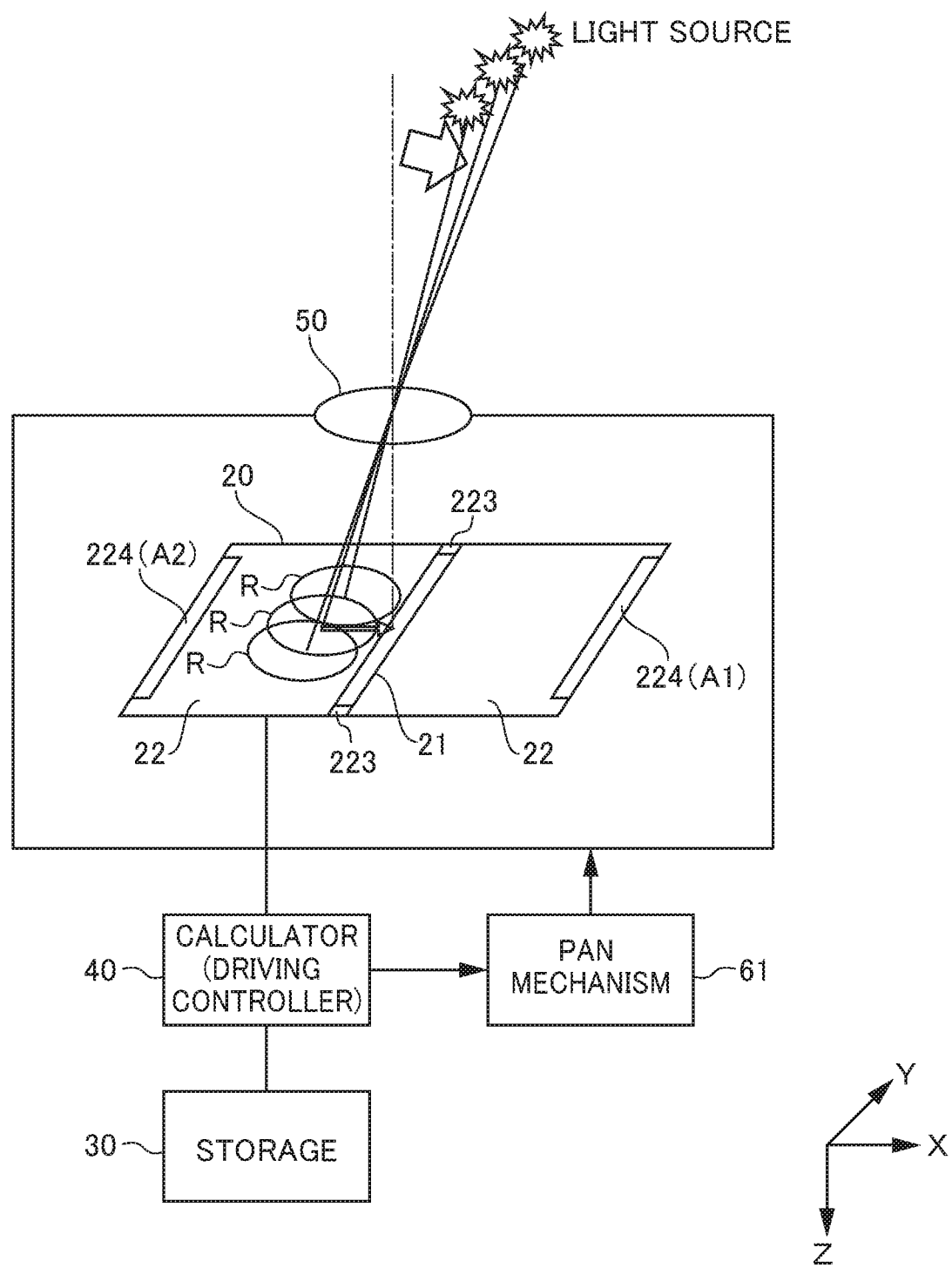
FIG. 12A is a view showing the configuration of a three-dimensional sensor 2 according to Modification 2 of the second embodiment (before light source tracking)
Figure 12B:
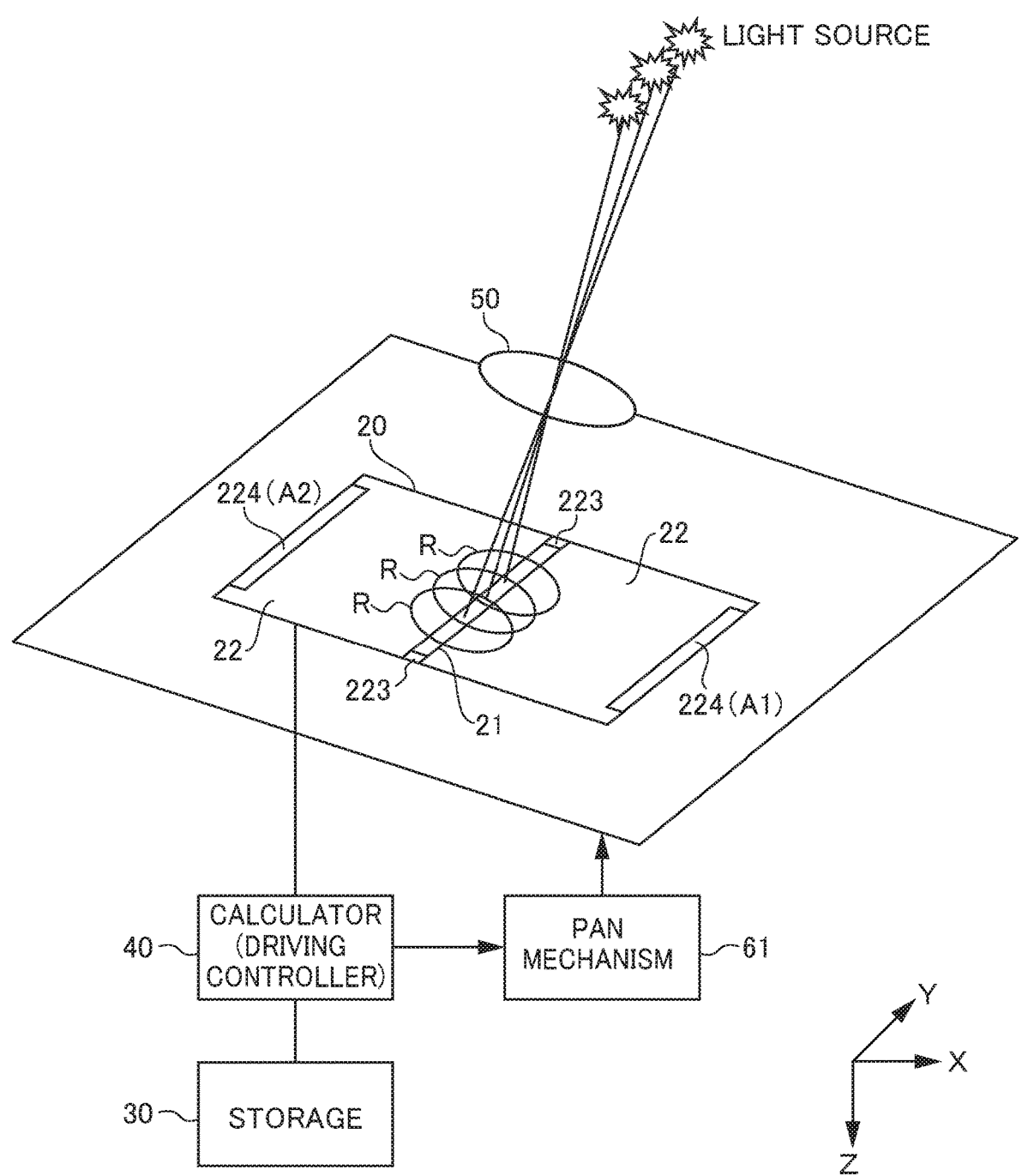
FIG. 12B is a view showing the configuration of a three-dimensional sensor 2 according to Modification 2 of the second embodiment (after light source tracking).

FIGS. 12A and 12B are views showing the configuration of the three-dimensional sensor 2 according to Modification 2 of the second embodiment. FIG. 12A shows a state before light source tracking, and FIG. 12B shows a state after light source tracking. As shown in FIGS. 12A and 12B, the three-dimensional sensor 2 of Modification 2 includes a pan mechanism (light source tracking mechanism) 61 in addition to the configuration of the three-dimensional sensor 2 of the second embodiment described above. In addition, as shown in FIG. 9A, the first sensitive region of the first sensitive part 21 of the photoelectric conversion element 20 is formed by one strip-like pattern that passes through the center of the light receiving surface and extends in the Y direction.

The calculator 40 functions as a driving controller for the pan mechanism 61, and generates a driving signal corresponding to the difference between the output currents of the two pairs of electrode layers 224, 234 of the second sensitive part 22 of the photoelectric conversion element 20. The pan mechanism 61 has a driving unit, such as a motor, and changes the direction of each optical unit of the optical lens 50 and the photoelectric conversion element 20 according to the driving signal generated by the calculator 40.

For example, assuming that the output currents of the two pairs of electrode layers 224, 234 of the second sensitive part 22 are A1 and A2, the calculator 40 generates a driving signal (pan) corresponding to the difference between the output current A1 and the output current A2 of the electrode layers 224, 234 arranged opposite to the Y axis. For example, in the case of A2>A1, the pan mechanism 61 changes (pans) the direction of the optical unit with respect to the Y axis so that A1=A2 is satisfied according to the driving signal corresponding to the difference between the output current A1 and the output current A2.

In this manner, the pan mechanism 61 can track the light source so that the center position (XY position) of the irradiation region R of the incident light on the light receiving surface of the photoelectric conversion element 20 becomes closer to the center position of the photoelectric conversion element 20 in the X direction, that is, the first sensitive part 21, by reducing the difference between the output currents of the two pairs of electrode layers 224, 234 of the second sensitive part 22 of the photoelectric conversion element 20.

Also in the three-dimensional sensor 2 of Modification 2, even if the irradiation region R of the incident light on the light receiving surface of the photoelectric conversion element 20 is out of the first sensitive part 21, the center position (XY position) of the irradiation region R can be made closer to the first sensitive part 21. As a result, the accuracy of the three-dimensional position detection of the light source is improved.

In addition, according to the three-dimensional sensor 2 of Modification 2, the three-dimensional positions of a plurality of light sources can be simultaneously detected by converting incident light beams from a plurality of light sources into modulated light beams (pulse light beams) that are modulated at different frequencies. The plurality of light sources are arranged in a direction in which the pattern of the first sensitive region of the first sensitive part 21 of the photoelectric conversion element 20 extends. Based on the output current modulated corresponding to the plurality of incident light beams output from the photoelectric conversion element 20, the calculator 40 may detect the incident direction of the incident light, the spot size of the incident light, and the position of the light source in the Z direction (depth) as described above for each frequency to detect the three-dimensional position of the subject.

In addition, in the three-dimensional sensor 2 of Modification 2, the form is illustrated in which the light source is tracked by the pan mechanism. However, the features of the three-dimensional sensor 2 of Modification 2 can also be applied to a form in which the light source is tracked by the tilt mechanism.

Although the embodiments of the present disclosure have been described above, the present disclosure is not limited to the above embodiments and various modifications can be made. For example, although the hetero-junction type photoelectric conversion element 20 have been illustrated as shown in FIG. 2 in the above embodiments, the features of the present disclosure are not limited to hetero-junction type photoelectric conversion elements and are applicable to various photoelectric conversion elements such as homo-junction type photoelectric conversion elements.

In the above embodiments, p-type semiconductor layers have been illustrated as the conductivity type semiconductor layer 221 on the light receiving surface side and n-type semiconductor layers have been illustrated as the conductivity type semiconductor layer 231 on the back surface side. However, the conductivity type semiconductor layer 221 on the light receiving surface side may be n-type semiconductor layers in which an amorphous silicon material is doped with an n-type dopant (e.g. phosphorus (P) described above), and the conductivity type semiconductor layer 231 on the back surface side may be p-type semiconductor layers in which an amorphous silicon material is doped with a p-type dopant (e.g. boron (B) described above).

Although n-type semiconductor substrates have been illustrated as the semiconductor substrate 210 in the above embodiments, the semiconductor substrate 210 may be p-type semiconductor substrates in which a crystalline silicon material is doped with a p-type dopant (e.g. boron (B) described above).

Although the photoelectric conversion elements each including the crystalline silicon substrate have been illustrated in the above embodiments, there is no limitation to this. For example, the photoelectric conversion element may include a gallium arsenide (GaAs) substrate.

What is claimed is:

1. A photoelectric conversion element including a photoelectric conversion substrate having first and second principal surfaces, the photoelectric conversion substrate comprising a first sensitive part and a second sensitive part that are separated from each other, wherein
the first sensitive part defines a first sensitive region on the first principal surface and the second sensitive part defines a second sensitive region on the first principal surface,
the first sensitive region is configured to receive at least a portion of incident light incident on the first principal surface in an irradiation region,
the first sensitive region forms a pattern such that a ratio of an area of the first sensitive region in the irradiation region to an area of the second sensitive region in the irradiation region decreases as a size of the irradiation region increases, and
the first sensitive region forms at least two or more strip-like patterns radially extending on the first principal surface.

2. The photoelectric conversion element according to claim 1, wherein the first sensitive region forms two of the strip-like patterns as orthogonal strip-like patterns.

3. The photoelectric conversion element according to claim 2, wherein at least one of the strip-like patterns has a constant width.

4. The photoelectric conversion element according to claim 2, wherein at least one of the strip-like patterns becomes wider from a center toward a periphery of the first principal surface.

5. The photoelectric conversion element according to claim 1, wherein at least one of the strip-like patterns has a constant width.

6. The photoelectric conversion element according to claim 1, wherein at least one of the strip-like patterns becomes wider from a center toward a periphery of the first principal surface.

7. The photoelectric conversion element according to claim 1, further comprising:
a plurality of first electrodes that output a first current from the first sensitive part; and
a plurality of second electrodes that output a second current from the second sensitive part,
wherein the plurality of first electrodes and the plurality of second electrodes are arranged so as to be separated in a peripheral region of the first principal surface.

8. The photoelectric conversion element according to claim 1, wherein the photoelectric conversion substrate contains a single-crystal silicon material.

9. The photoelectric conversion element according to claim 8, further comprising
a first conductivity type semiconductor layer formed at one of the first and second principal surfaces of the photoelectric conversion substrate, and
a second conductivity type semiconductor layer formed at an other of the first and second principal surfaces of the photoelectric conversion substrate.

10. The photoelectric conversion element according to claim 9, wherein,
the first sensitive part further defines the first sensitive region on the second principal surface and the second sensitive part further defines the second sensitive region on the second principal surface, and
at at least one of the first and second principal surfaces of the photoelectric conversion substrate, the first sensitive region and the second sensitive region are separated from each other.

11. The photoelectric conversion element according to claim 10, further comprising
a first passivation layer, the first conductivity type semiconductor layer, and a first transparent electrode layer sequentially formed at the first principal surface, and continuous between the first sensitive region and the second sensitive region, and
a second passivation layer, the second conductivity type semiconductor layer, and a second transparent electrode layer sequentially formed at the second principal surface, such that the second principal surface has a separation between the first sensitive region and the second sensitive region.

12. The photoelectric conversion element according to claim 10, further comprising
a first passivation layer, the first conductivity type semiconductor layer, and a first transparent electrode layer sequentially formed at the first principal surface, such that the first principal surface has a separation between the first sensitive region and the second sensitive region, and
a second passivation layer, the second conductivity type semiconductor layer, and a second transparent electrode layer sequentially formed at the second principal surface, and continuous between the first sensitive region and the second sensitive region.

13. A photoelectric conversion device, comprising the photoelectric conversion element according to claim 1.

14. The photoelectric conversion device according to claim 13, further comprising
a calculator configured to calculate a spot size of the incident light incident on the photoelectric conversion element based on a first output current of the first sensitive part and a output current of the second sensitive part in the photoelectric conversion element.

15. The photoelectric conversion device according to claim 13, further comprising
an optical lens arranged on an upstream side of the incident light,
wherein the photoelectric conversion element is arranged on a downstream side of the incident light.

16. The photoelectric conversion device according to claim 15, further comprising
a light source tracker configured to track a light source, which emits the incident light, so that a center of the irradiation region of the incident light on the first principal surface of the photoelectric conversion element becomes closer to the first sensitive part by reducing a difference between output currents of a plurality of the second electrodes based on the difference between the output currents of the plurality of second electrodes of the second sensitive part in the photoelectric conversion element.

17. A photoelectric conversion element including a photoelectric conversion substrate having first and second principal surfaces, a first conductivity type semiconductor layer formed at one of the first and second principal surfaces of the photoelectric conversion substrate, a second conductivity type semiconductor layer formed at an other of the first and second principal surfaces of the photoelectric conversion substrate, the photoelectric conversion substrate comprising a first sensitive part and a second sensitive part that are separated from each other, wherein
the first sensitive part defines a first sensitive region on the first principal surface and the second sensitive part defines a second sensitive region on the first principal surface,
the first sensitive region is configured to receive at least a portion of incident light incident on the first principal surface in an irradiation region,
the first sensitive region forms a pattern such that a ratio of an area of the first sensitive region in the irradiation region to an area of the second sensitive region in the irradiation region decreases as a size of the irradiation region increases,
the photoelectric conversion substrate contains a single-crystal silicon material,
the first sensitive part further defines the first sensitive region on the second principal surface and the second sensitive part further defines the second sensitive region on the second principal surface, and
at at least one of the first and second principal surfaces of the photoelectric conversion substrate, the first sensitive region and the second sensitive region are separated from each other.

* * * * *